United States Patent
Hawryluk et al.

(10) Patent No.: US 9,691,613 B2
(45) Date of Patent: Jun. 27, 2017

(54) FORMATION OF HETEROEPITAXIAL LAYERS WITH RAPID THERMAL PROCESSING TO REMOVE LATTICE DISLOCATIONS

(71) Applicant: Ultratech, Inc., San Jose, CA (US)

(72) Inventors: Andrew M. Hawryluk, Los Altos, CA (US); Ganesh Sundaram, Concord, MA (US); Ritwik Bhatia, Newtonville, MA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 14/899,552

(22) PCT Filed: Jun. 25, 2014

(86) PCT No.: PCT/US2014/044076
§ 371 (c)(1),
(2) Date: Dec. 17, 2015

(87) PCT Pub. No.: WO2015/002782
PCT Pub. Date: Jan. 8, 2015

(65) Prior Publication Data
US 2016/0155629 A1 Jun. 2, 2016

Related U.S. Application Data

(60) Provisional application No. 61/842,207, filed on Jul. 2, 2013, provisional application No. 61/881,369, filed on Sep. 23, 2013.

(51) Int. Cl.
*H01L 21/20* (2006.01)
*H01L 21/36* (2006.01)
(Continued)

(52) U.S. Cl.
CPC ........ *H01L 21/0262* (2013.01); *B23K 26/034* (2013.01); *B23K 26/0738* (2013.01);
(Continued)

(58) Field of Classification Search
CPC ............... H01L 21/2026; H01L 21/268; H01L 21/02532; H01L 21/02686
See application file for complete search history.

(56) References Cited

U.S. PATENT DOCUMENTS

| 4,477,308 A | 10/1984 | Gibson et al. |
| 4,900,372 A | 2/1990 | Lee et al. |

(Continued)

FOREIGN PATENT DOCUMENTS

| CN | 100464393 C | 2/2009 |
| EP | 2230334 A1 | 9/2010 |

(Continued)

OTHER PUBLICATIONS

English translation of Official Letter, TW application No. 103122526, Issued Dec. 22, 2016.
(Continued)

*Primary Examiner* — Zandra Smith
*Assistant Examiner* — John M Parker
(74) *Attorney, Agent, or Firm* — Royse Law Firm, PC

(57) ABSTRACT

Method and devices are disclosed for device manufacture of gallium nitride devices by growing a gallium nitride layer on a silicon substrate using Atomic Layer Deposition (ALD) followed by rapid thermal annealing. Gallium nitride is grown directly on silicon or on a barrier layer of aluminum nitride grown on the silicon substrate. One or both layers are thermally processed by rapid thermal annealing. Preferably the ALD process use a reaction temperature below 550° C. and preferable below 350° C. The rapid thermal annealing step raises the temperature of the coating surface to a (Continued)

temperature ranging from 550 to 1500° C. for less than 12 msec.

9 Claims, 10 Drawing Sheets

(51) Int. Cl.

| | | |
|---|---|---|
| H01L 21/04 | (2006.01) | |
| H01L 21/02 | (2006.01) | |
| C23C 16/22 | (2006.01) | |
| H01L 29/20 | (2006.01) | |
| H01L 21/268 | (2006.01) | |
| B23K 26/03 | (2006.01) | |
| B23K 26/073 | (2006.01) | |
| B23K 26/122 | (2014.01) | |
| C23C 16/56 | (2006.01) | |
| H01L 21/324 | (2006.01) | |
| B23K 26/12 | (2014.01) | |
| B23K 103/00 | (2006.01) | |

(52) U.S. Cl.
CPC ........ *B23K 26/122* (2013.01); *B23K 26/1224* (2015.10); *C23C 16/22* (2013.01); *C23C 16/56* (2013.01); *H01L 21/0254* (2013.01); *H01L 21/02381* (2013.01); *H01L 21/02433* (2013.01); *H01L 21/02458* (2013.01); *H01L 21/02598* (2013.01); *H01L 21/02675* (2013.01); *H01L 21/02694* (2013.01); *H01L 21/268* (2013.01); *H01L 21/3245* (2013.01); *H01L 29/2003* (2013.01); *B23K 2203/56* (2015.10)

(56) References Cited

U.S. PATENT DOCUMENTS

| | | | |
|---|---|---|---|
| 5,810,924 A | 9/1998 | Legoues et al. | |
| 5,891,769 A | 4/1999 | Liaw et al. | |
| 6,329,063 B2 | 12/2001 | Lo et al. | |
| 7,648,927 B2* | 1/2010 | Singh | C23C 16/0227 257/E21.12 |
| 7,829,442 B2 | 11/2010 | Westhoff et al. | |
| 8,202,575 B2 | 6/2012 | Monsma et al. | |
| 2004/0247787 A1* | 12/2004 | Mackie | C23C 16/40 427/248.1 |
| 2004/0259387 A1 | 12/2004 | Yamazaki et al. | |
| 2006/0049738 A1* | 3/2006 | Tabata | C01B 13/11 313/362.1 |
| 2007/0277735 A1 | 12/2007 | Mokhlesi | |
| 2008/0241421 A1 | 10/2008 | Chen et al. | |
| 2008/0251812 A1* | 10/2008 | Yoo | H01L 21/02381 257/183 |
| 2008/0308835 A1 | 12/2008 | Pan | |
| 2009/0120924 A1 | 5/2009 | Moffatt et al. | |
| 2009/0181553 A1 | 7/2009 | Koelmel et al. | |
| 2010/0166955 A1 | 7/2010 | Becker et al. | |
| 2010/0183825 A1 | 7/2010 | Becker et al. | |
| 2010/0233876 A1 | 9/2010 | Matsumoto et al. | |
| 2010/0247763 A1 | 9/2010 | Coutu et al. | |
| 2011/0192820 A1 | 8/2011 | Yeom et al. | |
| 2011/0244617 A1 | 10/2011 | Su | |
| 2011/0244663 A1 | 10/2011 | Su | |
| 2012/0064245 A1 | 3/2012 | Becker et al. | |
| 2013/0020581 A1 | 1/2013 | Teraguchi et al. | |
| 2013/0082280 A1 | 4/2013 | Lin et al. | |
| 2013/0099284 A1 | 4/2013 | Tserng et al. | |
| 2013/0137267 A1* | 5/2013 | Chang | H01J 37/3244 438/694 |
| 2013/0140525 A1 | 6/2013 | Chen et al. | |
| 2013/0210220 A1 | 8/2013 | Chu et al. | |
| 2014/0145147 A1 | 5/2014 | Kobayashi et al. | |
| 2015/0348773 A1* | 12/2015 | Zhu | C23C 14/0036 438/503 |

FOREIGN PATENT DOCUMENTS

| | | |
|---|---|---|
| JP | 4994530 B2 | 8/2012 |
| WO | 2012069521 A1 | 5/2012 |

OTHER PUBLICATIONS

S. Strite et al., GaN, AlN and InN: A review: J. Vac. Technolo. B 10(4) Jul./Aug. 1992.
Doe, Strategies for wide-bandgap, inexpensive transistors for controlling high efficiency systems (switches) (SBIR/STTR), Financial Assistance Finding Opportunity Announcement, Jun. 11, 2013.
Millan, Wide band gap semiconductor devices for power electronics, Automatika 53(2012) 2, 107-116 Mar. 6, 2012.
Kukushkin, Substrates for Epitaxy of Gallium Nitride: New Materials and techniques, Rev.Adv.Mater.Sci. 17(2008), Dec. 10, 2007.
Pan, Growth of GaN film on Si(111) substrate using AlN sandwich structure as buffer, Journal of Crystal Growth, vol. 318, Issue 1, Mar. 1, 2011, pp. 464-467,The 16th International Conference on Crystal Growth (ICCG16)/The 14th International Conference on Vapor Growth and Epitaxy (ICVGE14), Mar. 1, 2011.
Lang, MOCVD growth of GaN islands by multistep nucleation layer technique, Journal of Crystal Growth 277 (2005) 64, Feb. 11, 2005.
Huang, ALD-grown Ultrathin AlN Film for Passivation of AlGaN/GaN HEMTs Publication Source:, Dept. of Electronic and Computer Engineering, Hong Kong University of Science and Technology, Clear Water Bay, Kowloon, Hong Kong, Apr. 2012.
Eddy et al, Atomic Layer Epitaxy of III-N Semiconductors: How Low (in T) Can You Go?, AVS 60th International Symposium and Exhibition, Electronic Materials and Processing Friday Sessions, Session EM+NS+SS+TF-FrM, Nov. 1, 2013.
Keyan, Structural analysis of metalorganic chemical vapor deposited AlN nucleation layers on Si (111), DSpace@MIT, Advanced Materials for Micro- and Nano-Systems (AMMNS), 2004.
Narayan et al, Domain epitaxy: A unified paradigm for thin film growth, Jour Appl Phys vol. 93, No. 1 Jan. 1, 2003, Oct. 21, 2002.
Tuoc, First Principle Study on the Domain Matching Epitaxy Growth of Semiconductor Hetero-Interface, Materials Transactions, vol. 49, No. 11 (2008) pp. 2491 to 2496, Special Issue on Advances in Computational Materials Science and Engineering V, #2008 The Japan Institute of Metals, Jul. 24, 2008.
Vispute et al, Epitaxial growth of AlN thin films on silicon (111) substrates by pulsed laser deposition, ResearchGate, May 1, 1995.
Janssen et al. Celebrating the 100th anniversary of the Stoney equation for film stress: Developments from polycrystalline steel strips to single crystal silicon wafers Publication, Thin Solid Films, vol. 517, Issue 6, pp. 1858-1867, Jul. 24, 2008.
Song et al, Large Scale Growth and Characterization of Atomic Hexagonal Boron Nitride Layers, pubs.acs.org/NanoLett, Jul. 20, 2010.
Kobayashi et al, Mechanical Transfer of GaN-based Devices Using Layered Boron Nitride as a Release Layer, ResearchLetter, vol. 484, Nature, pp. 223-227, Apr. 12, 2012.
Green et al, Hall Effect Measurements Essential for Characterizing High Carrier Mobility, Keithley Instruments, Inc. pp. 1-4, Nov. 28, 2011.
Reshchikova et al, Luminescence properties of defects in GaN, J. Appl. Phys. 97, pp. 1-95, 061301 s2005d, Mar. 15, 2005.
Ohr, Forecast Analysis: Gallium Nitride Power Semiconductors, Worldwide, 2010-2015, Forecast Analysis: Gallium Nitride Power Semiconductors, Worldwide, 2010-2015 Gartner, Inc. and/or its Affiliates, Aug. 26, 2011.
Alevli, The influence of growth temperature on the properties of AlN film growth by atomic layer deposition Acta Physica Poloncia A vol. 120 (2011) Proceedings of the E-MRS fall Meeting Sep. 19-23, 2011.
Nepal et al, Epitaxial growth of cubic and hexagonal InN thin films via plasma assisted atomic layer epitaxy, Crystal growth design 2013, 13, 1485-1490. Published Feb. 7, 2013.
Kim et al., Atomic layer deposition of GaN using GaCl3 and NH3, J. Vac. Sci Technol. A 27(4) Jul./Aug. 2009 Published Jun. 2009.

(56) References Cited

OTHER PUBLICATIONS

Ozgit et al., Self-limiting growth of GaN at low temperatures, Acta Physica Poloncia A vol. 120 (2011) Proceedings of be E-MRS fall Meeting Sep. 19-23, 2011.
Baliga, The future or power semiconductor device technology, Proceedings of the IEEE, vol. 89, No. 6 Jun. 2001, pp. 822-832.
Chen et al., Wafer temperature measurement and control during laser spike annealing, 15th IEEE International conference on Advanced Thermal Processing of Semiconductors, 2007.
Briere, GaN on Si based power devices: an opportunity to significantly impact global energy consumption, CS Mantech Conference, May 17-20, 2010, Portland, OR, pp. 221-224.
Office Action, issued Jun. 2, 2016, Finland patent application No. 20156028.
Search Report, issued Jun. 2, 2016, Finland patent application No. 20156028.
Written Opinion, issued Jun. 20, 2016, Singapore patent application No. 11201510292V.
ISR and WO, Issued Dec. 19, 2014, PCT application PCT/US2014/056172.
SR and WO, Issued Oct. 27, 2014, PCT application PCT/US2014/044076.
Office Action, JP 2016-543977, Issued Mar. 22, 2017.
Burrows et al, "Infrared spectroscopy of Si(111) surfaces after Hf treatment: Hydrogen termination and surface morphology", Appl. Phys Lett. 53(11), Sep. 12, 1988.
Liu et al., Domain matching epitaxial growth of high-quality ZnO Film using a Y2O3 buffer layer on Si (111), American chemical Society, 2009.

\* cited by examiner

TMA reaction with surface hydroxyl groups on Si surface

FORMATION OF HETEROEPITAXIAL LAYERS WITH RAPID THERMAL PROCESSING TO REMOVE LATTICE DISLOCATIONS

1 CROSS REFERENCE TO RELATED U.S. PATENT APPLICATIONS

The present application claims priority under 35 U.S.C. §119(e) to U.S. Provisional Patent Application No. 61/842,207 filed Jul. 2, 2013, which is incorporated herein by reference in its entirety and for all purposes.

The present application also claims priority under 35 U.S.C. §119(e) to U.S. Provisional Patent Application No. 61/881,369 filed Sep. 23, 2013, which is incorporated herein by reference in its entirety and for all purposes.

2 COPYRIGHT NOTICE

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice shall apply to this document: Copyright 2013 Ultratech Inc.

3 BACKGROUND OF THE INVENTION

3.1 Field of the Invention

The exemplary, illustrative, technology herein relates to thermal material processing and solid state device manufacturing. More specifically the technology herein relates to improved methods for heteroepitaxial and epitaxial growth of semiconductor materials onto a single crystal substrate or wafer using an Atomic Layer Deposition (ALD) process followed by a rapid thermal annealing step. In particular, group III/V nitride films are grown on single crystal silicon wafers in an ALD reaction chamber and rapid thermal annealing is used to restructure the deposition films to remove dislocations and reduce internal stress s.

3.2 The Related Art

GaN is an important semiconductor material usable to emit blue or violet light in Light Emitting Diodes (LED) and blue lasers. While it is highly desirable to grow single crystal GaN layers on single crystal silicon wafer substrates conventional heteroepitaxial GaN devices are constructed by growing a GaN layer onto on a sapphire substrate in part to reduce a mismatch between the crystal lattice spacing of silicon as compared to the crystal lattice spacing of GaN and further due to a mismatch between the Thermal Coefficient of Expansion (TCE) of silicon as compared GaN.

Generally single crystal sapphire substrates cost significantly more than single crystal silicon substrates in part because of lower raw material cost for silicon but also because the silicon substrate manufacture is more widely known and practiced. Unfortunately conventional wisdom continues to maintain that single crystal silicon is not as suitable as single crystal sapphire when manufacturing GaN and AlN devices and more generally that for heteroepitaxial growth of any of the group III-V compounds (e.g. comprising Boron, Aluminum, Gallium, Indium and Thallium) and group II-VI compounds (e.g. comprising Cadmium and Zinc) and group III-N compounds silicon is not the best substrate choice. Instead the sapphire substrate is still in widespread use.

Thus there is a need in the art to develop a manufacturing technique suitable for heteroepitaxial growth of the group III-V compounds (e.g. comprising Boron, Aluminum, Gallium, Indium and Thallium) and or the group II-VI compounds (e.g. comprising Cadmium and Zinc) and group III-N on silicon substrates to at least take advantage of the reduced material and processing costs available afforded by use of silicon wafer based devices.

While the sapphire substrate provides good stability, low reactivity and ability to withstand the rigors of semiconductor device processing its cost, its dielectric nature and its large bandgap, preclude the possibility of fabricating devices with backside electrical contacts and have led to renewed interest in seeking alternate substrate materials with silicon being the most desirable.

3.3 Crystal Lattice Spacing Mismatch

Heteroepitaxial growth is generally more successful when the crystal lattice structure or lattice spacing of dissimilar materials is reasonably matched. This is true because the crystal lattice spacing of deposition or active layer attempts to match the lattice spacing of the substrate layer near the heteroepitaxial boundary and this action generally disorganizes the formation of the natural lattice spacing of the deposition layer to the point that the deposition layer formed at least proximate to the heteroepitaxial boundary is substantially amorphous or at best polycrystalline. In one scenario the deposition layer growth nucleates in single crystal groups forming independently but at different crystal lattice orientations with dislocations formed at the boundaries between independent single crystal formations. The dislocations further disrupt single crystal growth causing a flawed single crystal structure or a polycrystalline structure. In practice flaws in the single crystal structure potentially leading to cracking in the deposition layer especially when the deposition layer is thermally stressed during a rapid thermal cycling. The conventional solution to this problem has been to avoid heteroepitaxial devices such by growing grow silicon deposition layers on silicon substrates to avoid dislocations and encourage single crystal growth. However silicon devices have failed to provide the desired electrical properties in many applications, especially in power devices such as power switches and rectifiers. Similarly silicon devices have failed to provide the desired optical properties for optical devices. In both cases higher band gap materials such a Gallium Nitride (GaN) are desirable as deposition or active layers and preferably the GaN are most economically formed on silicon substrates.

Single crystal sapphire is a single crystal form of corundum ($Al_2O_3$) also known as alpha aluminum, alumina. Sapphire's crystal structure is a hexagonal system, rhomboidal class 3 m which makes single crystal sapphire more compatible as a substrate for the growth of single crystal or nearly single crystal III-V compounds (e.g. comprising Boron, Aluminum, Gallium, Indium and Thallium) than silicon. Additionally group II-VI compounds (e.g. comprising Cadmium and Zinc) and III-N have similar crystal structures to the II-V compounds such that single crystal sapphire substrates are more compatible for heteroepitaxial growth of these compounds than single crystal silicon substrates. In particular silicon and GaN have a crystal lattice mismatch of 16.9% while sapphire and GaN have a crystal lattice mismatch of 13.62% providing a slight advantage to sapphire.

It is highly desirable for single crystal formation (long term order) in active deposition layers in order to provide homogeneous electrical and or optical properties. Specifically this means forming a substantially uniform crystal lattice orientation throughout the layer volume and the more uniform the crystal lattice orientation of the active deposition layer the better the electrical and optical properties of the eventual semiconductor device is likely to be. In the case of laser and laser diode devices comprising a gallium nitride active layer, better crystal orientation leads to increased luminous intensity at the device output and a narrower spectral bandwidth of the output radiation wherein substantially all the spectral output is at the primary spectral response of the device.

3.4 Thermal Cycling and Thermal Coefficient of Expansion Mismatch

It is widely accepted that single crystal heteroepitaxial layers can only be formed at an epitaxial growth temperature Tg which for GaN is reported to be at least 550° C. See e.g. Trivedi et al. *Low-temperature GaN growth on silicon substrates by single gas-source epitaxy and photo-excitation*; Appl. Phys. Lett. 87, 072107 (2005). It is known to manufacture semiconductor lasers and LED's by forming GaN layers onto a substantially single crystal sapphire substrate using a conventional Metal Organic Chemical Vapor Deposition (MOCVD) process. In particular it is generally accepted that the highest quality conventional GaN devices are fabricated when the deposition temperature is in the range of 900 to 1100° C. However even in the highest quality devices some crystal lattice defects caused by crystal lattice spacing mismatch are inevitable at the heteroepitaxial boundary.

Moreover even with the effort taken to match the TCE of the sapphire substrate with the GaN the high temperature range of 900 to 1100° C. required in a conventional MOCVD reactor necessitates strict thermal stress management in order to avoid excessive wafer bow and cracking resulting from thermal cycling with non-matched TCE materials. Typically wafer bow is limited to less than less than 100 μm in order for the wafer to be further processed on conventional wafer handling and processing tools for high volume manufacturing. While wafer bow has been addressed by forming "stress compensation layers" in MOCVD films, these stress compensation layers degrade the device layer performance and add cost.

3.5 Use of an Aluminum Nitride (AlN) Transition Layer

Recently Pan et al. (*Growth of GaN film on Si*(111) *Substrate using a AlN sandwich structure as buffer* Joun. Of Crystal Growth 318 (2011) 464-467) report attempts to grow device quality GaN onto a Si (111) substrate. In this example a sandwich structure formed by an AlN nucleation layer formed on a Si(111) substrate followed by mixed AlN/GaN transition layers and finally an active GaN layer were all formed by metal-organic chemical vapor deposition (MOCVD) at 1060° C. in attempt to reduce undesirable cracking due to the large crystal lattice spacing mismatch (16.9%) between the GaN and the silicon and the large coefficient of thermal expansion (CTE) mismatch between GaN ($\alpha_a$ 5.59×10$^{-6}$ K$^{-1}$) and Si($\alpha_a$ 3.77×10$^{-6}$ K$^{-1}$). While it was hoped that the sandwich structure would alleviate surface cracks the results were disappointing. While Pan et al. report that the GaN epitaxial layers grew uniformly on Si substrates the active layer suffered from randomly distributed cracks, which they report are mostly caused by the CTE mismatch.

3.6 Diffusion Across the Heteroepitaxial Boundary

One drawback of the growing films on substrates at high temperature (above about 800° C.) is related to diffusion that can occur at the layer boundaries. In particular substrate nitridation can occur at the high deposition temperatures. Additionally the extreme thermal gradients and thermal cycling range can lead to some cracking in the films and the substrates. In one particular example gallium nitride layers are grown with a high concentration of nitrogen vacancies at conventional MOCVD temperatures of 900 to 1100° C. The nitrogen vacancies lead to a high background carrier concentration in the device thus degrading electrical and electro-optical properties.

While attempts have been made to grow the GaN films at lower temperatures while still using a MOCVD process on sapphire; films grown at 500° C. have a 1000 times weaker photoluminescence than films grown at 800° C. (reference). Another drawback of high reaction temperature MOCVD processing is that indium and some other group III-V and group II-VI compounds have a thermal stability than prevents their use above 800° C. thus limiting the extent to which high reaction temperature MOCVD processing can be used to deposit some group III-V and group II-VI compounds on any substrate. Thus there is a need in the art to develop a lower temperature deposition technique.

Experimenters have attempted to deposit GaN onto single crystal silicon substrates with some success. However, the films that have formed generally include mixed crystal lattice orientations (i.e. they are not single crystals) even when the silicon substrate is a single crystal. This is due in part to the mismatch in crystal lattice structure between silicon and gallium nitride. Unfortunately the resulting LED and laser devices are not competitive with conventional devices manufactured with single crystal lattice orientation on single crystal sapphire.

3.7 Growing Heteroepitaxial Layers Using Atomic Layer Deposition

Atomic Layer Deposition (ALD) systems are available that can deposit material layers at lower deposition temperatures e.g. 80-550° C. and techniques and precursors suitable for depositing both GaN and AlN onto a silicon substrate by an ALD process are known and discloses in the below listed references.

Kim and co-workers in *Atomic layer deposition of GaN using GaCl$_3$ and NH$_3$* (J. Vac. Sci. Technol. A 27, 4, July/August 2009), have grown GaN on Si(100) substrates by ALD in a temperature window of 500-700° C. The halogenated precursors GaCl, and GaCl$_3$, were used with NH$_3$ as the co-reactant on a silicon substrate. The exposure time of the GaCl$_3$ precursor was varied over the range of 2-7 seconds. The results indicate mixed crystallographic orientations of GaN, e.g. a mixture of (0002) and (1011) oriented GaN and high Cl-content in the films which would be detrimental for device applications.

The X-ray Diffraction (XRD) results shown in FIG. 4A plots (410) and (420) are from films grown via ALD at 550-650 C for a 25 sec exposure time and a 7 sec exposure time respectively. Note the mixed crystal orientation, and the weak crystallinity in plot (420) formed with a lower exposure time as compared to plot (410) formed with a longer exposure time. By comparison, the XRD results in FIG. 4B are from high temperature MOCVD grown GaN (grown at 900-1100° C.). Note the clear monocrystalline nature of the MOCVD film grown at 900-1100° C. which exhibits a predominantly GaN(0002) crystal structure.

Ozgit and coworkers (Proceedings of the E-MRS Fall Meeting, Symposium H: Warsaw, Poland, Sep. 19-23, 2011), have grown GaN on Si(100) substrates by plasma-enhanced atomic layer deposition using trimethyl gallium (TMG) and trimethyl gallium (TEG) and ammonia (NH3) precursors in a temperature window of 250-350° C. for TMG and 150-350° C. for TEG. No crystallinity measurements are provided. They report the films exhibited linear growth behavior with an oxygen content of 19.5 to 22.5%.

AlN, while traditionally being grown via MOCVD or sputtering to produce device quality films, has also been attempted via ALD, though to a very small extent.

Results from Alevli and co-workers—in The Influence of Growth Temperature on the Properties of AlN Films Grown by ALD (Proceedings of the E-MRS Fall Meeting, Symposium H: Warsaw, Poland, Sep. 19-23, 2011), using TMA and $NH_3$ as the precursor and co-reactant indicates high temperature growth is not feasible due to thermal decomposition of the precursors—this in turn leading to rougher films at higher temperatures. Crystallinity is claimed at low temperatures (100-200 C), but no results are presented.

Other results on growth of AlN via ALD has been shown by Liu and co-workers (ECS Transactions, 2011) to produce mixed crystalline results even at process temperatures up to 400 C—however, with progressively weakening (101) orientation, and a strengthening of the desired (002) orientation, as the temperature increases, (See present FIG. 5).

There is a need in the art to deposit GaN onto silicon substrates. Growing GaN devices onto Si potentially decreases the cost of these devices considerably. However, the lattice structure of Si is sufficiently different than the lattice structure of GaN, so that, dislocations are abundant and single crystal layers of GaN are not formed. There have been many attempts to circumvent this problem by depositing onto Si wafers that are cut so that the lattice constant of the exposed surface is more similar to the lattice constant of GaN. Other attempts have been through depositing an AlN buffer layer onto Si and then growing the GaN layer onto the AlN layer. The AlN acts as a buffer layer and relaxes the stresses in the GaN film caused by the different lattice constants between GaN and Si. However, a significant problem is that all of the deposition processes are at elevated temperatures. The thermal expansion coefficient of Aluminum Nitride (AlN) and GaN are different than Si, leading to growth defects during the film deposition process due to the Thermal Coefficient of Expansion (TCE) mismatch.

It would be desirable to be able to grow the GaN directly on a Si substrate at or near room temperature, or to grow an AlN buffer layer onto Si, followed by GaN active layer on top of the AlN at low temperatures, e.g. at or below 350° C.

4 BRIEF DESCRIPTION OF THE DRAWINGS

The features of the present invention will best be understood from a detailed description of the invention and example embodiments thereof selected for the purposes of illustration and shown in the accompanying drawings in which.

5 DESCRIPTION OF SOME EMBODIMENTS OF THE INVENTION

Figure 1:
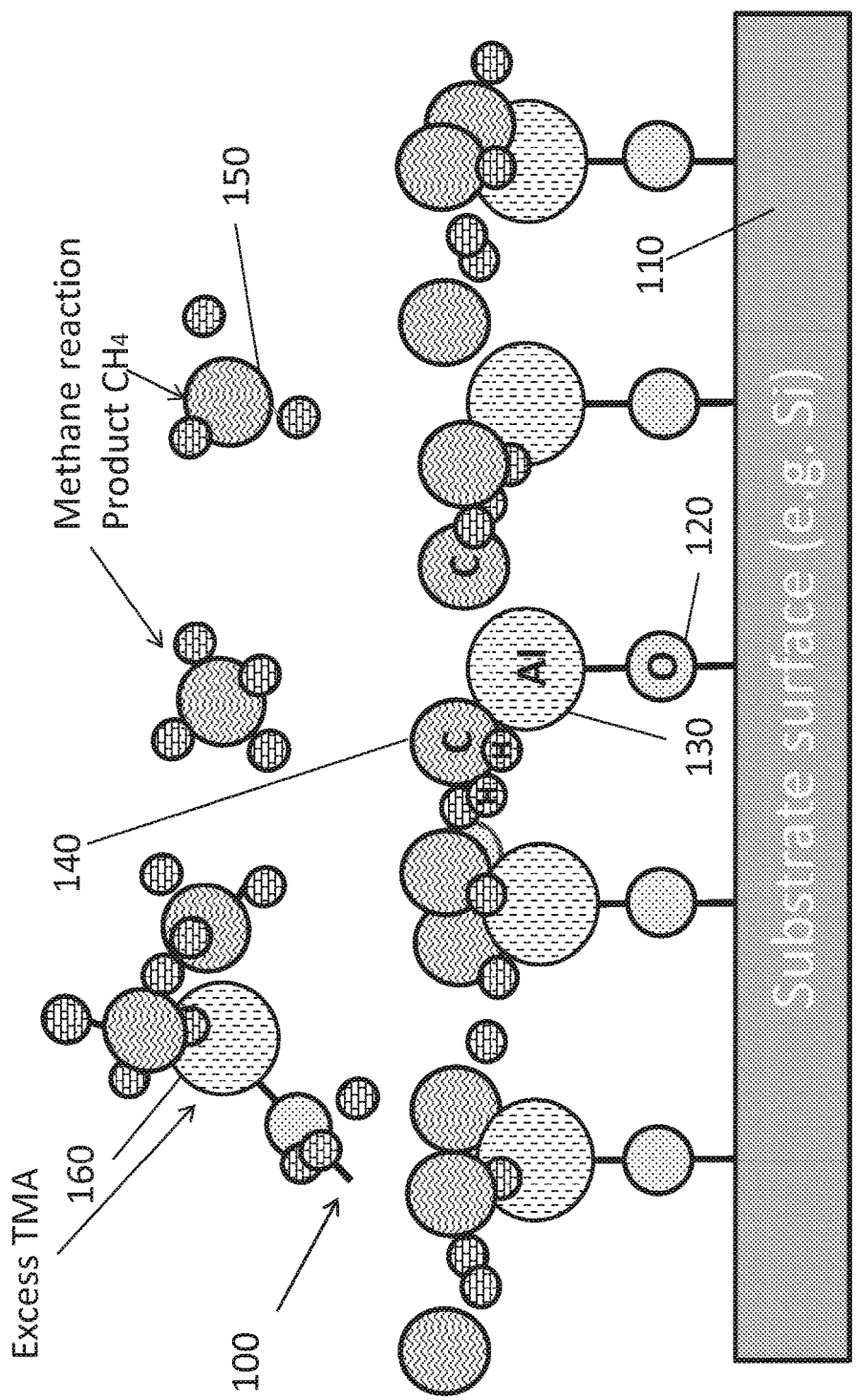
FIG. 1 depicts an exemplary schematic diagram of a first ALD process reaction for depositing Aluminum oxide onto a silicon substrate.

The following item numbers are used throughout, unless specifically indicated otherwise.

| #   | DESCRIPTION |
| --- | --- |
| 100 | First reaction |
| 103 | Fold mirror |
| 105 | Linear motion stage |
| 116 | Linear lens |
| 110 | Substrate |
| 120 | Hydroxyl group |
| 130 | First precursor |
| 140 | Methane Groups |
| 150 | Reaction by-product |
| 160 | Unreacted precursor |
| 170 | Al—O Bridge |
| 180 | Hydroxyl group |
| 190 | Reaction by-product |
| 200 | Second reaction |
| 300 | Wafer Structure |
| 310 | Silicon substrate |
| 320 | Aluminum Nitride buffer layer |
| 330 | Gallium Nitride active layer |
| 410 | XRD plot |
| 420 | XRD plot |
| 430 | XRD plot |
| 440 | Primary Lattice Orientation |
| 450 | Secondary Lattice Orientation |
| 455 | Peak annealing temperature |
| 460 | Substrate temperature |
| 465 | 600° C. |

-continued

| # | DESCRIPTION |
|---|---|
| 510 | XRD plot |
| 520 | XRD plot |
| 530 | XRD plot |
| 540 | Primary energy peak |
| 550 | Secondary energy peak |
| 560 | Secondary energy peak |
| 700 | ALD System |
| 702 | Annealing beam |
| 705 | Reaction chamber |
| 710 | Substrate |
| 712 | Coating surface |
| 715 | Support element |
| 720 | Process gas module |
| 725 | Exhaust module |
| 730 | Control module |
| 735 | Laser Annealing system |
| 740 | Protective element |
| 745 | Gate module |
| 800 | Laser annealing system |
| 805 | Laser module |
| 807 | Beam forming module |
| 810 | Laser beam |
| 815 | Beam directing module |
| 820 | Power controller module |
| 825 | Emission detector |
| 830 | Temperature conversion module |
| 835 | Electronic interface |
| 840 | Preheat laser |
| 845 | Laser beam |
| 850 | Coating surface |
| 855 | Substrate surface |
| 860 | Linear motion stage |
| 865 | Lens system |
| 870 | ALD chamber |
| 900 | Beam directing module |
| 905 | Linear laser beam |
| 910 | Coating surface |
| 920 | Coating surface |
| 925 | Substrate |
| 930 | Annealing beam |
| 935 | Peak temperature |
| 940 | Temperature gradient |
| 945 | Temperature gradient |
| 950 | Temperature gradient |
| 955 | Temperature gradient |

5.1 Exemplary System Architecture

According to one non-limiting exemplary embodiment of the present invention Atomic Layer Deposition (ALD) is used to deposit thin films onto planar and non-planar substrate surfaces in processes related to the manufacture of epitaxial active layers onto a substrate in a manner suitable for eventual fabrication of finished semiconductor electronic and electro-optical devices. The ALD film deposition described herein is preferably conducted at reaction temperatures ranging from 80-350° C. in order to avoid thermal cycling defects such as active layer film cracking, wafer bow and diffusion across the boundary between the active layer and the substrate that are normally problematic with active layer deposition at higher temperatures e.g. when active layer films are applied by MOCVD at 900-1100° C.

In one non-limiting example embodiment a substrate comprising a substantially single crystal semiconductor is placed in an ALD reaction chamber and heated to a desired ALD reaction temperature. Additionally gas is removed from the reaction chamber such that the reaction chamber internal gas pressure is in a range of 1-500 mTorr (militorr) during the film deposition process. Notwithstanding the desirability to limit ALD reaction temperatures to the preferred range of 80-350° C., ALD reaction temperatures ranging from 80-800° C. may be used without deviating from the present invention.

In one specific non-limiting application of the present invention ALD is used for heteroepitaxial growth of group III-V, group II-VI and group III-N compounds on single crystal silicon substrates with Miller index orientations of Si (100) and Si (111) at reaction temperatures ranging from 80-650° C. and preferably at reaction temperatures ranging from 80-350° C.

In a further non-limiting example embodiment of the present invention ALD is used to deposit a plurality of different material layers selected from one or more different group III-V, group II-VI and group III-N compounds onto a single silicon substrate, and particularly a substantially single crystal silicon substrate having a Miller index orientation of Si(111) or Si (100) wherein the ALD reaction chamber environment is maintained at less than 800° C. and preferably less than 350° C. during the entire film deposition process. In one particularly useful example ALD is used to grow a buffer layer of AlN on the silicon substrate and then to grow an GaN active layer on top of the AlN buffer layer while maintain the ALD reaction chamber environment at less than 800° C. and preferably less than 350° C. during the entire film deposition process.

In a further non-limiting example embodiment of the present invention each ALD film layer is annealed by a rapid thermal annealing process wherein the annealing step briefly raises the temperature of at least the deposition layer to a temperature that allows some crystal lattice re-structuring of the deposition film. In particular a preferred anneal step results in restructuring the deposited material in a manner that cause the deposition layer to exhibit a lattice crystal structure that is more characteristic of a single crystal lattice structure with a single crystal lattice orientation e.g. as determined by X-RAY Diffraction (XRD) analysis.

In particular one non-limiting exemplary embodiment of the present invention is directed to growing an Aluminum nitride (AlN) film layer onto a substantially single crystal silicon substrate, e.g. a wafer, as a buffer layer wherein the buffer layer is deposited by ALD at a low reaction temperature, e.g. less than 800° C. and preferably less than 350° C., and thereafter thermally annealing the AlN buffer layer in a manner that causes improvements in the crystal lattice structure to the extent that the improved crystal lattice structure of the AlN film exhibits a lattice structure that is more characteristic of a single crystal lattice structure as determined by X-RAY Diffraction (XRD) analysis.

In a second deposition step a Gallium nitride (GaN) active film layer is deposited onto the AlN buffer layer by ALD at a low reaction temperature, e.g. less than 800° C. and preferably less than 350° C., and thereafter thermally annealing the GaN active film layer in a manner that causes improvements in the crystal lattice structure thereof to the extent that the improved crystal lattice structure of the GaN film exhibits a lattice structure that is more characteristic of a single crystal lattice structure as determined by X-RAY Diffraction (XRD) analysis.

In particular another non-limiting example embodiment the present invention is directed to growing an Aluminum nitride (AlN) film layer onto a substantially single crystal silicon substrate, e.g. a wafer, as a buffer layer wherein the buffer layer is deposited by ALD at a low reaction temperature, e.g. less than 800° C. and preferably less than 350° C.

In a second deposition step a Gallium nitride (GaN) film layer is deposited onto the AlN buffer layer by ALD at a low reaction temperature, e.g. less than 800° C. and preferably less than 350° C., and thereafter the combined AlN and GaN layers are thermally annealed in a manner that causes improvements in the crystal lattice structure of the GaN film to the extent that the improved crystal lattice structure of the GaN film exhibits a lattice structure that is more characteristic of a single crystal lattice structure as determined by X-RAY Diffraction (XRD) analysis.

5.1.1 Depositing an Aluminum Oxide Layer onto a Silicon Substrate by Atomic Layer Deposition An example low reaction temperature thermal ALD deposition cycle is set forth below. A plasma assisted ALD deposition cycle is also usable without deviating from the present invention. Example 1 demonstrates the chemical reactions and process steps for depositing a monolayer of aluminum oxide ($Al_2O_3$) onto a silicon substrate. In practice an ALD film growth or deposition comprises applying between 10 and 200 monolayers onto the silicon substrate to build up a desired thickness of the film deposition layer as required to perform its desired function.

While the below described example thermal ALD process relates to depositing a single monolayer of aluminum oxide layer onto a silicon substrate, the process described is a typical thermal ALD deposition or film growth process and may be used substantially as described to grow films other than aluminum oxide, such as aluminum nitride and gallium nitride by changing one or both of the precursors. Similarly in many instances a film that can be grown by the below described thermal ALD process can be grown using a Plasma Enhanced ALD (PEALD) process wherein the second precursor is replaced by plasma generated radicals.

Aluminum oxide is grown using a thermal ALD process described below at reaction temperatures between 80° C.-250° C. with trimethyl aluminum $Al_2(CH_3)_6$ also abbreviated (TMA) or $(Al_2Me_3)_2$ being introduced as the first precursor used in a first reaction with surfaces of the silicon substrate and water ($H_2O$) being introduced as the as the second precursor used in a second reaction with surfaces of the silicon substrate. The reactions are as follows for growth on a Si surface:

FIG. 1 illustrates a first reaction (100) that takes place on the surface of a Si substrate (110) that has adsorbed hydroxyl (OH) groups (120) present on an external surface of the substrate wherein hydroxyl (OH) groups include various chemical functional groups having an Oxygen atom connected to a Hydrogen atom by a covalent bond to hydrogen (OH).

In a first step the silicon substrate is placed in a reaction chamber and the chamber pressure is pumped down to a pressure ranging from 1-500 mTorr. A vacuum pump operates to establish and maintain a desired reaction pressure within the reaction chamber. The reaction chamber, the substrate and the precursor are heated to a desired reaction temperature e.g. 80-250° C. Generally a continuous flow of inert gas e.g. nitrogen, argon or the like is introduced into the reaction chamber during the entire coating cycle to provide an inert environment in the reaction chamber. Alternately or additionally the inert gas acts as a carrier gas for carrying pulses of precursor into the reaction chamber.

In a second step a vapor containing a first precursor (130), e.g. TMA molecules is introduced into a reaction chamber preferably as a single pulse that includes just enough TMA to react with exposed surfaces of the silicon substrate. The TMA (130) reacts with the OH groups (120) on the surface of the silicon substrate (110) until all available sites are occupied and then the reaction stops. The reaction is said to be self-limiting because once all the available OH groups have bonded with a TMA molecule, the silicon surface is saturated and the reaction stops. After the first reaction the silicon substrate surface presents dangling methane groups (140) which provide reaction sites for a second reaction described below.

In a third step the reaction chamber is purged with an inert gas to remove reaction by-products (150), which includes methane, and to remove the excess unreacted TMA (160). The purge continues until the vacuum pump removes a gas volume equal to at least the volume of the reaction chamber and any conduits leading into the reaction chamber. Optionally a trap is disposed between the reaction chamber and the vacuum pump to trap or remove the unreacted reacted precursor from the outflow.

Figure 2:
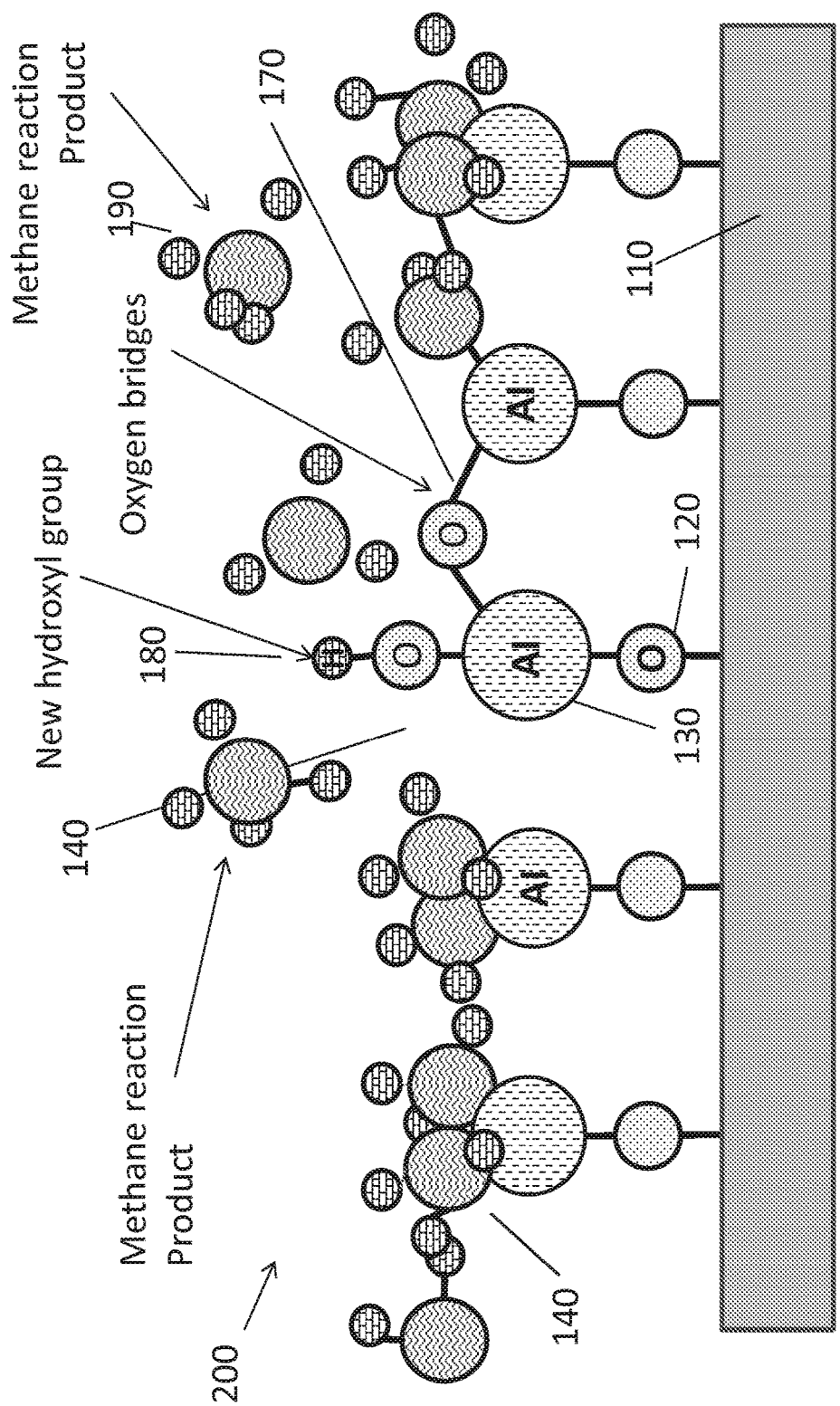
FIG. 2 depicts an exemplary schematic diagram of a second ALD process reaction for depositing Aluminum oxide onto a silicon substrate.

Referring now to FIG. 2 the silicon substrate (110) is shown in its initial state for a second reaction wherein TMA molecules (130) are bonded to hydroxyl groups (120) with the dangling methane groups (140) disposed on the surface of the silicon substrate as provided by the first reaction. A second reaction (200) takes place between the substrate surface and a second precursor as follows:

In a fourth step vapor containing a second precursor e.g. $H_2O$ molecules, (not shown) is introduced into a reaction chamber preferably in a single pulse that includes just enough water to react with exposed surfaces of the silicon substrate. The $H_2O$ reacts with the dangling methyl groups (140) forming Al—O bridges comprising ($Al_2O_3$), (170) and further forming new hydroxyl (OH) surface groups (180), suitable for reacting with TMA as described above in the first reaction.

In a fifth step the reaction chamber is purged with an inert gas to remove reaction by-products (190), which includes methane, and to remove the excess unreacted second precursor $H_2O$, (not shown). The purge continues until the vacuum pump removes a gas volume equal to at least the volume of the reaction chamber and any conduits leading into the reaction chamber. The unreacted $H_2O$ may be routed through the optional trap. After the second reaction a single monolayer of aluminum oxide ($Al_2O_3$) remains on the surface of the silicon substrate and the monolayer presents hydroxide groups suitable for reacting with TMA such that the first monolayer is already conditioned to repeat steps 1-5 above to grow another monolayer over the first monolayer.

The first monolayer layer thickness or growth rate per cycle for the aluminum oxide monolayer formation detailed above is approximately 1.0 Å. In most ALD deposition processes the silicon substrate is left in the reaction chamber and additional monolayers are added by repeating the above described deposition cycle as many times as may be required to develop a desired thickness of aluminum oxide onto the silicon substrate. In typical applications layer thicknesses ranging from about 10-200 Å are applied using 10-200 coating cycles.

While the above described process for depositing an aluminum oxide monolayer is not a specific aspect of the present invention the ALD process described is substantially identical to the ALD process of the present invent except that the first and second precursors are different and the final monolayer instead of comprising aluminum oxide ($Al_2O_3$) comprises gallium nitride (GaN).

Thus according to a further non-limiting example embodiment of the present invention a gallium nitride GaN monolayer is grown or deposited onto a single crystal silicon substrate by performing the above described or similar thermal ALD deposition sequences wherein the first precursor for forming GAN is Trimethyl Gallium (TMG), Triethyl Gallium (TEG), or any other metal-organic Ga-containing compound, or Gallium trichloride ($GaCl_3$), or any other Ga containing halogenated precursors, and the second precursor is ammonia ($NH_3$), hydrazine ($N_2H_2$), $N_2$, $N_2$—$H_2$ ratio mixture, monatomic Nitrogen, or monatomic Hydrogen, or any combination of monatomic Nitrogen and monatomic Hydrogen, or any other nitrogen or hydrogen containing co-reactant. Additionally a gallium nitride GaN monolayer can be grown onto silicon using a Plasma Enhanced Atomic Layer Deposition (PEALD) process wherein the second precursor comprises plasma radicals.

Specifically in a first step the silicon substrate is placed in a reaction chamber and the chamber pressure is pumped down to a pressure ranging from 1-500 mTorr by a vacuum pump that operates continuously to establish and maintain a desired reaction pressure within the reaction chamber. As will be recognized by those skilled in the art the gas pressure inside the reaction chamber varies during the ALD cycle with the highest gas pressure occurring during purge cycles when inert gas is introduced into the reaction chamber to flush out untreated precursor and reaction by-product and pressure also increases during pulse cycles when a precursor pulse or plasma gas is introduced into the reaction chamber. Otherwise the vacuum pump operates to remove gas from the reaction chamber thereby reduce reaction chamber pressure between purge and pulse cycles.

The reaction chamber, the substrate and the precursor are heated to a desired reaction temperature e.g., between 80-350° C. More specifically, the reaction chamber, substrate and precursors are heated once at startup, e.g. when the substrate is placed into the reaction chamber, to a desired reaction temperature and maintained at a substantially constant reaction temperature during the entire deposition cycle e.g. until the desired deposition layer thickness is achieved, e.g. over 10 to 200 monolayer coating cycles. Thus the substrate and deposition layers are never heated above the desired reaction temperature as a result of heating the ALD reaction chamber or any of its components. Preferably a continuous flow of inert gas e.g. nitrogen or argon or the like is introduced into the reaction chamber during the entire coating cycle to provide an inert environment in the reaction chamber. Alternately or additionally the inert gas acts as a carrier gas for carrying pulses of precursor into the reaction chamber.

In a second step a vapor containing a first precursor, e.g. Trimethyl Gallium (TMG) or Triethyl Gallium (TEG) molecules is introduced into a reaction chamber preferably as a single pulse that includes just enough first precursor to react with exposed surfaces of the silicon substrate. The precursor dose is varied by varying pulse duration of a pulse valve which opens and closes according to user variable pulse durations. In the case of TMG which has a very high vapor pressure at room temperatures pulse valve durations ranging from 10-500 msec provide full saturation of the silicon substrate. The precursor exposure time to the substrate surface is user variable by varying the time in seconds between injecting the first precursor pulse into the reaction chamber and starting to purge the reaction chamber to flush the first precursor pulse from the reaction chamber. In the case of TEG which has a high vapor pressure an exposure time of TEG in the reaction chamber of at least 2 seconds provides substantially saturated deposition at a reaction temperature of about 150° C. In this example TEG reacts with the surface of the silicon substrate until all available sites are occupied and then the reaction stops. After the first reaction the silicon substrate surface presents dangling reaction sites for a second reaction described below.

In a third step the reaction chamber is purged with an inert gas to remove reaction by-products and unreacted TEG. The purge continues until the vacuum pump removes a gas volume equal to at least the volume of the reaction chamber and any conduits leading into the reaction chamber. Optionally a trap is disposed between the reaction chamber and the vacuum pump to trap or remove the unreacted reacted precursor from the outflow.

In a fourth step a vapor containing a second precursor, e.g. ammonia ($NH_3$) or hydrazine ($N_2H_2$), molecules is introduced into a reaction chamber e.g. as a single pulse that includes just enough second precursor to react with exposed surfaces of the silicon substrate. The precursor dose is varied by varying pulse duration of a pulse valve which opens and closes according to user variable pulse durations. In the case of ammonia (NH3) a longer pulse duration and exposure time is used to achieve saturation. Specifically a continuous flow of NH3 for 20 to 150 seconds is desirable depending on temperature and other conditions with preferred pulse duration of 90 seconds at 150° C.

In a fifth step the reaction chamber is purged with an inert gas to remove reaction by-products an unreacted second precursor NH3. The purge continues until the vacuum pump removes a gas volume equal to at least the volume of the reaction chamber and any conduits leading into the reaction chamber. The unreacted NH3 may be routed through the optional trap. After the second reaction a single monolayer of Gallium Nitride (GAN) remains on the surface of the silicon substrate and the monolayer presents surface groups suitable for reacting with TEG such that the first monolayer is already conditioned to repeat steps 1-5 above to grow another monolayer over the first monolayer.

Similarly growing an aluminum nitride AlN monolayer onto silicon is performed by the above described sequence wherein the first precursor is trimethyl aluminum (TMA), TDMAA, or any other metal-organic Al precursor, or halogenated Al precursor and the second precursor is ammonia ($NH_3$), ($N_2H_2$), $N_2$, $N_2$—$H_2$ ratio mixture, monatomic Nitrogen, or monatomic Hydrogen, or any combination of monatomic Nitrogen and monatomic Hydrogen, or any other nitrogen or hydrogen containing co-reactant. Additionally an aluminum nitride AlN monolayer can be grown onto silicon using a PEALD process.

Figure 3:
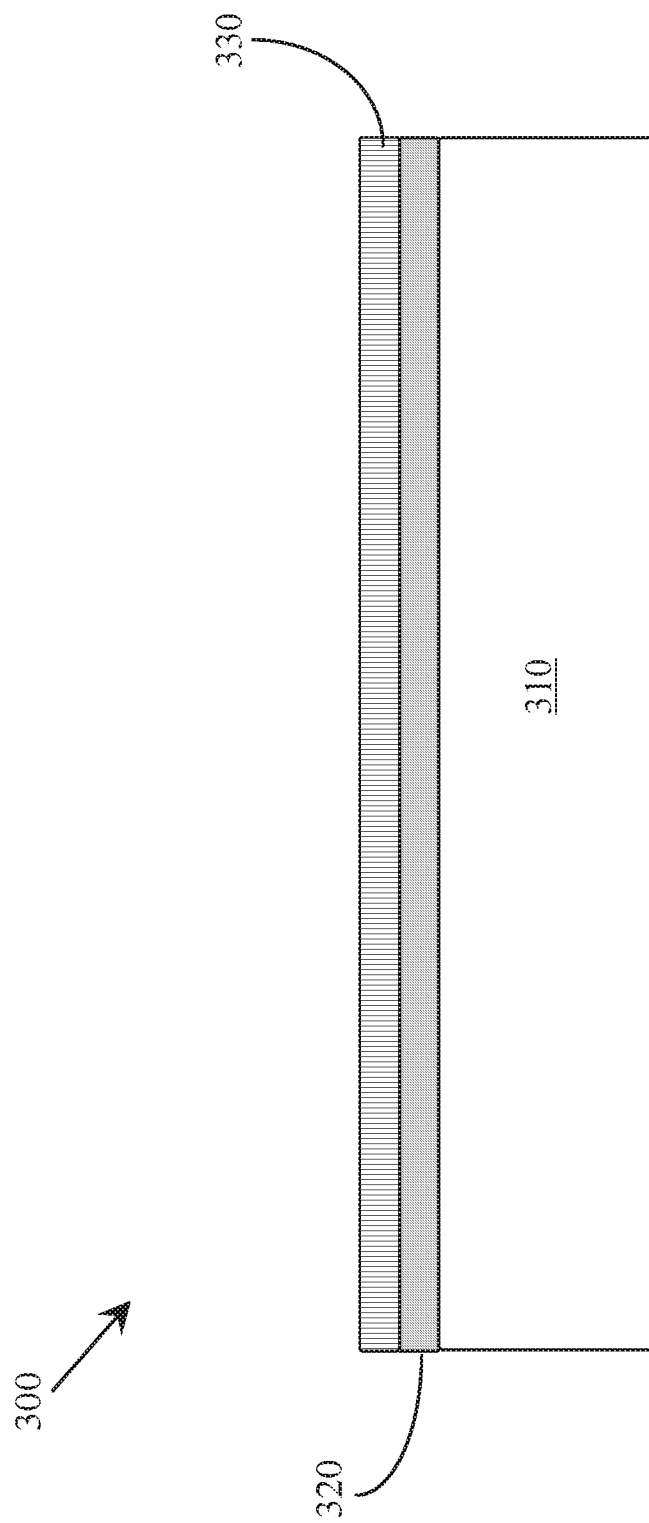
FIG. 3 depicts an exemplary schematic diagram of a wafer structure suitable for device manufacture according to the present invention.

Referring now to FIG. 3 an example solid state wafer structure (300) according to one aspect of the present invention includes a silicon substrate (310) such as a substantially single crystal silicon wafer of Si(111). Accordingly the silicon wafer comprises a substantially orderly single lattice crystal structure with few crystal structure defects are usable without deviating from the present invention.

The substrate is installed into an ALD reaction chamber and heated to a desired reaction temperature and the reaction chamber is pumped down to a pressure of 1-500 mTorr, e.g. 250 mTorr. A first ALD film deposition cycle is used to grow a first layer (320) onto the substrate. Preferably the first layer (320) is grown at a reaction temperature ranging from 80-350° C. In a preferred embodiment the first layer (320) comprises an aluminum nitride buffer layer having a thickness of between 10 and 2000 Å.

Since the solid state aluminum nitride (AlN) buffer layer and the single crystal silicon substrate have similar crystal structures and reasonably matched coefficients of thermal expansion the ALD applied layer of aluminum nitride (320)

preferably exhibits single crystal properties or near single crystal properties e.g. as may be determined by X-Ray Diffraction (XRD) patterns, as will be described below. In the specific instance wherein the buffer layer comprises AlN which has a relatively small TEM mismatch with Si, a higher reaction temperature is usable to grow the AlN buffer layer without surface cracks. In particular the buffer film (320) is alternately deposited at a reaction temperature ranging up to about 550° C. which helps to promote single crystal growth as compared to lower deposition temperatures. However the preferred deposition temperature for the buffer layer provides near single crystal growth with acceptable thermal defects including an acceptable level of surface cracks, an acceptable level of AlN diffusion into the Si substrate and an acceptable wafer bow.

More generally other buffer materials are usable with the material selection criteria being: 1) the buffer material has appropriate ALD precursors; 2) the crystal lattice spacing mismatch between the buffer material and each of the Si substrate and the GaN active layer is reasonably small e.g. less than 18% and preferably less than 10%; and, 3) that the CTE mismatch between the buffer layer and each of the Si substrate and the GaN active layer is reasonably small e.g. the CTE of the buffer layer is preferably between the CTE of GaN ($\alpha_a$ 5.59×10$^{-6}$ K$^{-1}$) and the CTE of Si ($\alpha_a$ 3.77× 10$^{-6}$K$^{-1}$). Additional if other Si orientations such as Si(100) are used the crystal lattice and CTE mismatch will be different. More generally both the buffer layer and the active layer are selected to from a substantially orderly crystal lattice structure wherein the orientation of the crystal lattice is substantially similar over the entire surface of the buffer layer (320) and the entire surface of the active layer (330). In the present example the silicon crystal lattice structure Si (111) is diamond cubic with an Fd3m space group which follows the face centered cubic bravais lattice. This structure is somewhat compatible with being matched with solid material that have a zincblende crystal structure as well as a hexagonal crystal system. The crystal structure of aluminum nitride is a wurtzite hexagonal crystal lattice structure. Accordingly based on crystal structure alone other material usable as the buffer layer (320) has a single crystal lattice structure that is compatible with diamond cubic. Accordingly other candidate material for the buffer layer (320) include gallium arsenide, β-silicon carbide, indium antimondide, cadmium telluride, Lead(II) nitrate, cadmiumselite (CdSe) as well as candidates from the F43M (Hermann-Mauguin notation) space group and the wurtzite group.

A second ALD film deposition cycle is used to grow a second layer (330) onto the buffer layer (320). Preferably the second layer (330) is grown at a reaction temperature ranging from 80-350° C. In a preferred embodiment the second layer (330) comprises a gallium nitride active layer having a thickness of between 10 and 2000 Å.

Since the solid state gallium nitride active layer and the single crystal aluminum nitride buffer layer have the same crystal lattice structures (wurtzite) the gallium nitride active layer (330) preferably exhibits single crystal properties or near single crystal properties e.g. as may be determined by X-Ray Diffraction (XRD) patterns, as will be described below. In any event the gallium nitride active layer (330) of the present invention exhibits improved near single crystal properties as compared to samples wherein the gallium nitride active layer (330) is directly applied onto the silicon substrate.

Gallium nitride is an important binary III/V direct bandgap semiconductor with desirable property for use as a light-emitting diode, especially those having a blue or violet emission wavelength at 405 nm. The crystal structure of gallium nitride is a wurtzite structure which is a direct match with the crystal structure of the aluminum nitride layer (320). According to the present invention other group III/V or group II/VI or group III/N compounds having the wurtzite crystal lattice structure may be used as the active layer (330) and other compounds having the wurtzite crystal lattice structure can be used instead of the buffer layer (320) provided that such compounds can be grown by thermal or plasma enhanced ALD.

Figure 4A:
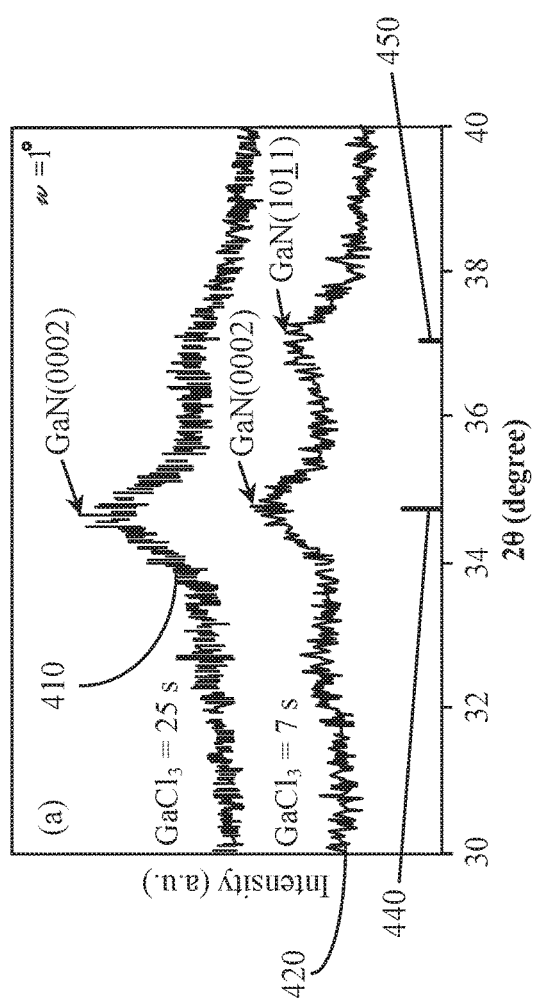
FIG. 4A depicts an XRD plot showing crystal lattice characteristics for two different GaN film layers deposited onto a silicon substrate using a thermal ALD process with different $GaCl_3$ exposure times.
Figure 4B:
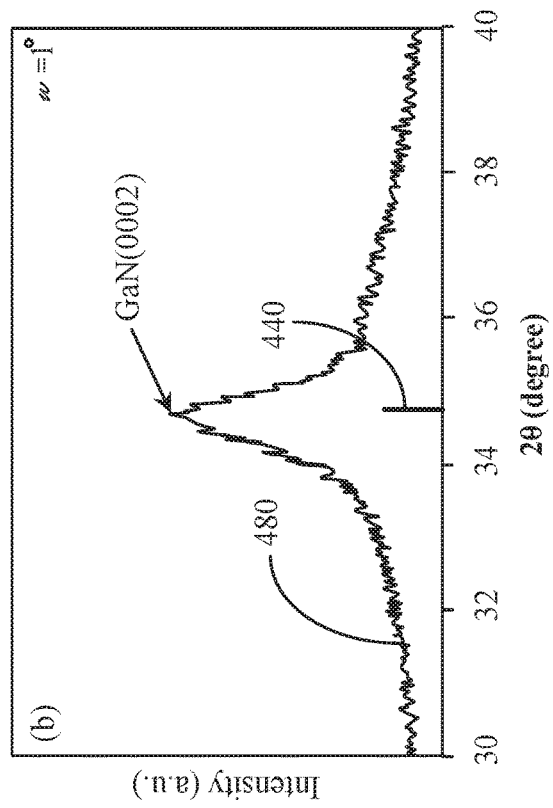
FIG. 4B depicts an XRD plot showing crystal lattice characteristics for a GaN layer deposited onto a substrate using an MOCVD process with a deposition temperature above 900° C.

Referring now to FIGS. 4A and 4B reproduced from Kim et al. in Atomic layer deposition of GAN using GaCl$_3$ an NH$_3$ J. Vac. Sci. Technol. A 27(4) July/August 2009 FIG. 4A shows two X-Ray Diffraction (XRD) plots of GaN deposited on a Si(100) substrate using ALD at growth temperature between 550 and 650° C. The first plot (420) is associated with a GaC3 exposure time of 7 seconds. The second plot (410) is associated with a GaC3 exposure time of 25 seconds.

FIG. 4B shows a single XRD plot of GaN deposited on a Si(100) substrate using Chemical Vapor Deposition (CVD) at 650° C. In particular the CVD mode is performed with all reactants flowing simultaneously. In each plot (410), (420) and (430) a desirable single crystal lattice orientation of a GaN layer is indicated when substantially all of the XRD scatter energy (intensity (a.u.)) is centered at a single crystal lattice orientation which in the present example is about 34.5 degrees shown at (440). The angle (440) indicates that the crystal lattice structure is primarily oriented at (0002) axial direction in the Miller orientation index. Thus of the three plots (410), (420), (430), plot (430), associated with GaN deposited on Si(100) by CVD at 650° C., exhibits the most desirable crystal lattice properties since nearly all of the XRD scatter energy is associated with a single crystal lattice orientation centered at the (0002) axial direction in the Miller orientation index. With respect to plots (410) and (420) each plot has a primary energy peak at or near the desired single crystal lattice orientation (440) but also includes a second energy peak at about 36.5 degrees as shown at (450). The second energy peak indicates that some of the crystal lattice has formed at a different orientation and specifically the 1011 axial direction in the Miller orientation index.

The plot (420) shown in FIG. 4A which shows the least desirable crystal lattice structure was generated based on a sample wherein the gallium nitride layer was formed directly onto a silicon substrate by a thermal ALD process. In particular the plot (420) relates to the use of Gallium Chloride (GaCl3) as a first precursor wherein the silicon substrate was exposed to gallium chloride for 7 seconds during each monolayer cycle.

The plot (410) shown in FIG. 4A which shows the a more desirable crystal lattice structure as compared to the plot (420) was generated based on a sample wherein the gallium nitride layer was formed directly onto a silicon substrate by a thermal ALD process. In particular the plot (410) relates to the use of Gallium Chloride (GaCl3) as a first precursor wherein the silicon substrate was exposed to gallium chloride for 25 seconds during each monolayer cycle.

Figure 5:
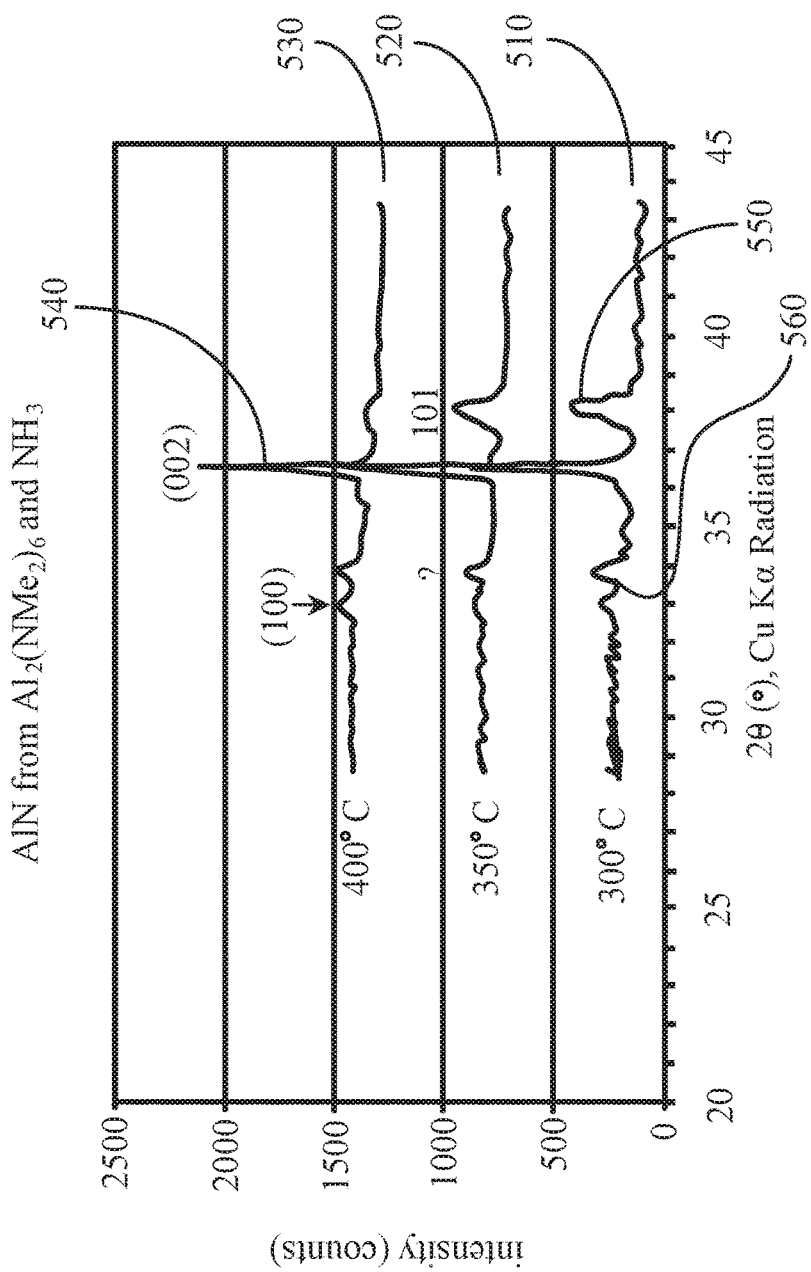
FIG. 5 depicts XRD plot showing crystal lattice characteristics for three different AlN film layers deposited onto a silicon substrate using a thermal ALD process at three different reaction temperatures.

Referring now to FIG. 5 an X-Ray Diffraction (XRD) pattern plot includes three curves (510), (520), and (530) associated with three different aluminum nitride (AlN) films grown directly onto a single crystal silicon substrate by a thermal ALD process using three different reaction temperatures. Each curve demonstrates a sharp energy peak at about 34.5 degrees shown at (540) which indicates that the crystal lattice structure is primarily oriented at (0002) axial direction in the Miller orientation index. Each of the curves (510) and (520) have two other energy peaks (550) and (560) indicating that at least some of the crystal lattice structure is not oriented at the desired orientation. As shown in the Figure the curve (510) is associated with an aluminum nitride film grown at an ALD reaction temperature of 300° C., the curve (520) is associated with an aluminum nitride film grown at an ALD reaction temperature of 350° C. and the curve (530) is associated with an aluminum nitride film grown at an ALD reaction temperature of 400° C. Of note from FIG. 5 is that the AlN films exhibit increasing XRD energy at the primary (0002) axial direction in the Miller orientation index indicating that increased ALD reaction temperature leads to improved single crystal orientation. Additionally the curve (540) suggests that the AlN film grown using an ALD process with a reaction temperature of 400° C. is a substantially single crystal film.

5.2 Rapid Thermal Processing

In a further non-limiting example aspect of the present invention ALD deposition layers are thermally processed by performing one or more rapid thermal processing steps. Each rapid thermal processing step is suitable for altering the crystal structure of one or more ALD deposition mono layers by raising the temperature of the mono layers. The rise in temperature of the mono layers removes crystal lattice dislocations which allow internal stresses of the crystal lattice structure of the deposition layer to relax. Additionally the rapid thermal processing step serves to improve the long term crystal structure order of the entire deposition layer which ultimately preferably includes between 10 and 200 monolayers. As a result the entire deposition layer forms a substantially uniform single crystal lattice structure having a substantially uniform crystal lattice structure orientation. Specifically each rapid thermal processing step comprises rapidly heating the coating surface from the deposition temperature to an annealing temperature and then allowed the coating surface to cool.

Preferably the rapid annealing step is performed inside the ALD reaction chamber without removing the substrate and without breaking vacuum. In a first non-limiting rapid thermal annealing sequence a rapid thermal annealing step is performed immediately after the deposition of each mono layer. In a second non-limiting rapid thermal annealing sequence a rapid thermal annealing step is performed after the deposition of each selected plurality of mono layers e.g. a rapid thermal annealing step is performed after the deposition of each 10 mono layers, or the like. In a third non-limiting rapid thermal annealing sequence, a rapid thermal annealing step is performed after compete deposition of a material layer to a desired thickness e.g. wherein the desired material layer thickness is 200 mono layers, the entire 200 mono layer thickness is applied by 200 ALD deposition cycles and the rapid annealing step is performed once for the desired material layer thickness.

In a preferred embodiment the thermal annealing step is performed by directing laser illumination onto material layers after being forms on the coatings surface and providing relative motion between the laser illumination and the coatings surface, e.g. by moving the laser illumination with respect to the substrate, by moving the substrate with respect to the laser illumination, or both. In a preferred embodiment the substrate is mounted on a linear motion device and move with respect to a fixed position illumination beam. As a result the coating surface advances past the laser illumination at a scan velocity wherein the scan velocity defines a dwell time during which the laser illumination is impinging on a given surface area of deposition material.

In one non-limiting example rapid thermal annealing process embodiment according to the present invention an ALD reaction chamber and a substrate being coated inside the ALD reaction chamber are maintained at a substantially constant ALD deposition temperature during an ALD deposition cycle. The ALD deposition cycle includes depositing between 10 and 2000 monolayer of a deposition material onto a coating surface of the substrate. After each mono layer is deposited onto the coating surface a single rapid thermal annealing step is performed. Each single rapid thermal annealing step includes scan wise illuminating the entire coating surface with a laser illumination beam wherein the laser illumination beam has sufficient luminous intensity over an appropriate spectral bandwidth focused to an appropriate laser illumination area to rapidly heat a surface area of the coating surface to a desired annealing temperature. The scan wise movement causes the laser illumination beam to impinge on the entire coating surface such that the entire coating surface is rapidly thermally annealed before another mono layer is applied.

Scan wise movement of the substrate provides relative motion between the fixed laser illumination beam and the coating surface. The substrate is moved at a substantially velocity and the laser illumination has a substantially constant area of illumination at the coating surface. As a result the area of illumination dwells on an area of the coating surface for a dwell time which is dependent on the area of the illumination beam at the coating surface and the relative velocity of the coating surface with respect to the area of the illumination beam. Thus the rapid thermal annealing step of the present invention includes rapidly heating the coating surface from the deposition temperature to an appropriate annealing temperature using laser illumination directed into each area of the coating surface for a desired dwell time. In further non-limiting embodiments of the present invention the dwell time, annealing temperature and deposition temperature may be varied according to the deposition process being carried out. Additionally according to an aspect of the present invention the laser luminous intensity at the coating surface is varied by varying input electrical power, e.g. by a varying laser input current with a current driver. Accordingly the laser luminous intensity output can be varied to selectively change the annealing temperature as may be required for different deposition materials or different rapid thermal annealing results.

Figure 6:
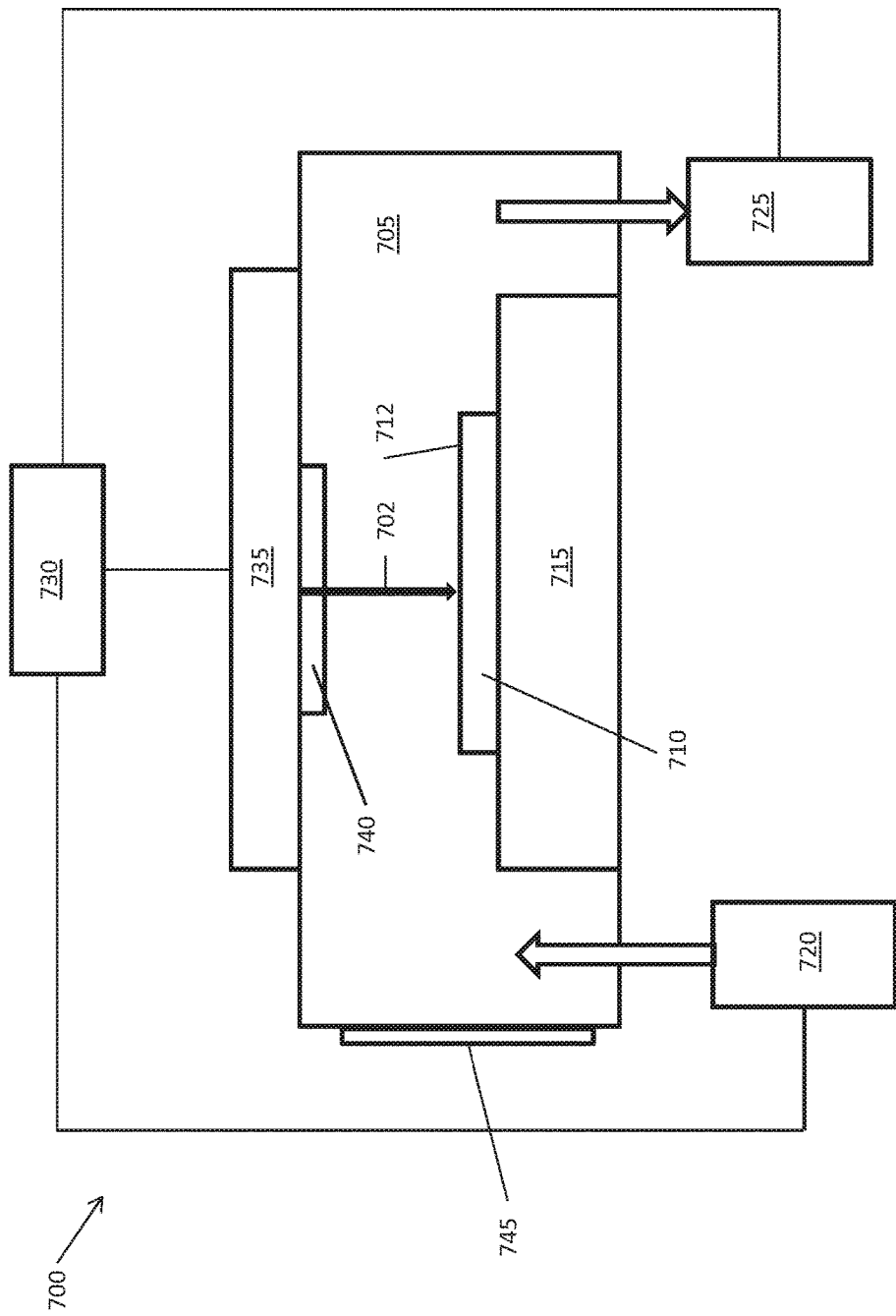
FIG. 6 depicts an schematic representation of an ALD system including a laser annealing module according to the present invention.

Referring now to FIG. 6 a non-limiting exemplary ALD system according to the present invention is show schematically. The ALD system (700) includes a reaction chamber (705) for supporting a wafer substrate or any other solid substrate (710) on a support element (715). The reaction chamber is constructed as a vacuum chamber and includes a gate or port module (745) and corresponding passage through a wall of the reaction chamber as required to install and remove the substrate through a front, back, side top or bottom wall of the reaction chamber (705). Alternately a top mounted hinged or removal lid provides access to install and remove the substrate there through. In any case the access means is a sealable opening, (not shown) suitable for providing access into the reaction chamber to install and remove the substrate and to vacuum seal the reaction chamber during deposition cycles.

A process gas module (720) delivers process gasses including inert gas and precursors in the form of gas and vapor reactants into the reaction chamber under the control of an electronic system controller (730). The controller (730)

includes a digital processor and associated memory suitable for running a software or firmware process management system. In addition various sensors and controllable elements, (not shown), electrically interfaced with the controller (730) provide process feedback such as local temperature, local gas pressure, process and device status as well as process control such by actuating switches and mechanical devices suitable for running automated deposition processes according to preset ALD film deposition recipe cycles.

An exhaust module (725) removes gas from the reaction chamber and includes a vacuum pump, or the like, and appropriate sensors, valves and other control elements suitable for maintaining the reaction chamber at a desired operating pressure and for purging the reaction chamber of reaction by-products and unreacted precursors between precursor reaction cycles. The reaction chamber (705) substrate (710) and process gases (720) are heated to a desired reaction temperature by various heating elements (not shown) under the control of the electronic system controller (730) and process management system software or the like. In various embodiments the same reaction temperature is used for every deposition coating material or different reaction temperatures are used for different coating materials.

Example ALD systems suitable for use with the present invention are disclosed in commonly assigned U.S. Pat. No. 8,202,575 to Monsma et al. dated Jun. 19, 2012 entitled VAPOR DEPOSITION SYSTEMS AND METHODS, inn US Pat. Appl. Pub. No. 201000183825 to Becker et al. dated Jul. 22, 2010 entitled PLASMA ATOMIC LAYER DEPOSITION SYSTEM AND METHOD, in US Pat. Appl. Pub. No. 20120064245 to Becker et al. dated Mar. 15, 2012 entitled ALD SYSTEMS AND METHODS, in commonly assigned US Pat. Appl. Pub. No. 20100247763 to Coutu et al. dated Sep. 30, 2010 entitled REACTION CHAMBER WITH REMOVABLE LINER and further in commonly assigned US Pat. Appl. Pub. No. 20100166955 to Becker et al. dated Jun. 1, 2012 entitled SYSTEM AND METHOD FOR THIN FILM DEPOSITION; all of which are incorporated by reference herein in their entirety.

The system (700) further includes a laser annealing module (735) disposed to direct a laser annealing radiation beam (702) onto deposition layers being deposited onto the substrate (710). The substrate (710) includes a coating surface (712) which faces the laser annealing module (735). Alternately, described above, one or both of the substrate (710) and the laser beam (702) is moved to scan the radiation beam (702) over the full coating surface (712) A protective element (740) is optionally movably disposable to open or close an optical aperture as needed e.g. to close the optical aperture to protect laser annealing optics during deposition cycles and to open the optical aperture to allow the laser beam to be directed onto the coating surface during laser annealing cycles. In an alternative embodiment the laser annealing module (735) or portions of the laser annealing module may be disposed inside the reaction chamber. In a first non-limiting example embodiment the laser annealing beam (702) is finely focused to a single point having a substantially Gaussian luminous intensity distribution with substantially circular or oval beam area at the coating surface. The single point beam is scanned over the entire coating surface (712) by any combination of relative motion between the single point beam and the coating surface.

Figure 8:
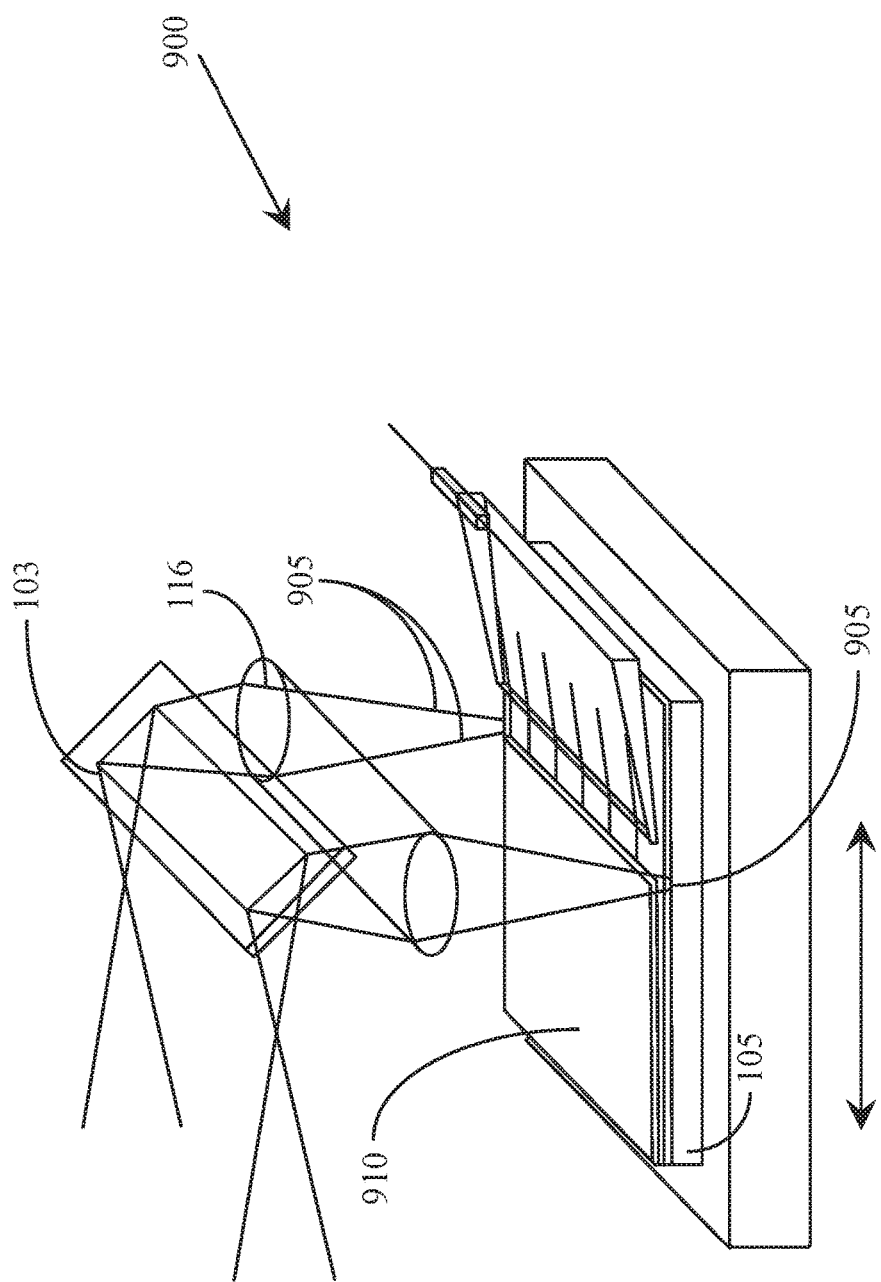
FIG. 8 depicts a schematic representation of a beam directing module according to the present invention.

Referring now to FIG. 8 a second non-limiting example embodiment of the laser annealing beam (702) comprises a focused laser illumination line (905) having a substantially constant luminous intensity across one linear axis of the coating surface (910). In this case the bean area at the coating surface has a longitudinal dimension that exceeds a dimension of the coating surface and the laser illumination line (905) is scanned over the coating surface by any combination of relative motion between the laser illumination line (905) and the coating surface (910). In any event elements of the laser annealing module (735) and any other modules used to provide relative motion between the radiation beam and the coating surface are controlled by the electronic controller (730) or by an electronic controller that is interfaced to the electronic controller (730) for cooperative process control.

In a further non-limiting example embodiment of the present invention the laser annealing module (735) is configured to illuminate the entire coating surface (712) with a single process beam or a plurality of different process beams without moving the laser beam or beams (702) and without moving the substrate (710). In this embodiment the radiation beam (702) comprises on or more radiation beams impinging on the coatings surface (712) to illuminate the entire full coatings surface (712) with a substantially uniform luminous intensity over the area of the coating surface and the radiation beam or beams are modulated by the laser annealing module (735) to illuminate the coating surface for a desired dwell time consistent with heating the entire coating surface to a desired annealing temperature without movement of the laser beam or the substrate.

Figure 7:
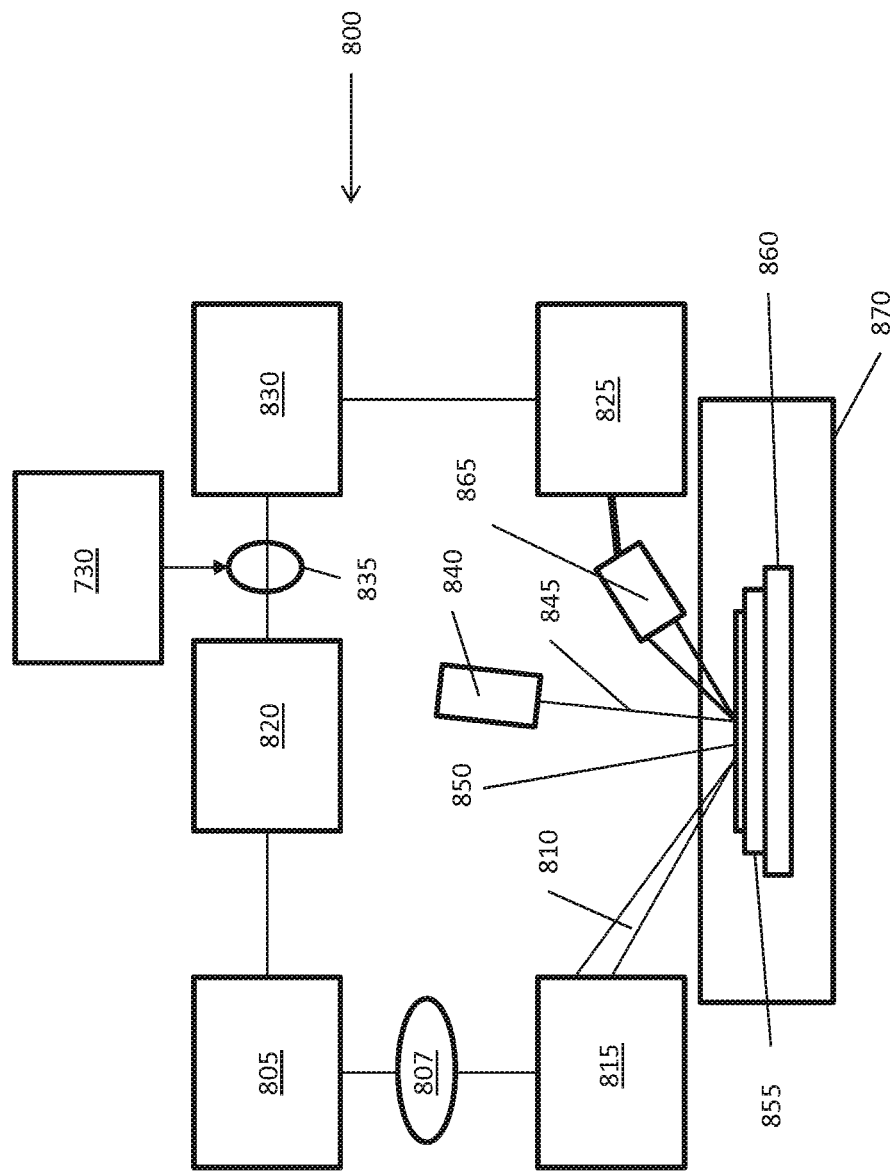
FIG. 7 depicts a schematic representation of a laser annealing module for in-situ laser annealing according to the present invention.

Referring to FIG. 7 a non-limiting exemplary laser annealing system (800) is shown in a schematic view. The laser annealing system (800) includes a laser module (805), for emitting a radiation beam (810), a first beam forming optical subsystem (807) for shaping the radiation beam, a beam directing module (815) for directing a focused radiation beam onto the coating surface and an input power control module (820) for inputting an electrical power signal to the laser module suitable for providing a desired laser luminous intensity output. In addition the laser annealing system (800) includes a lens system (865) forming an image of the coating surface on an emission detector (825) which generates an image signal which is analyzed by a temperature conversion module (830) used to monitor a temperature at the coating surface. An electronics interface (835) interfaces with the ALD reactor electronic controller (730) to coordinate the rapid thermal annealing and material deposition activity and provide a user interface to the laser annealing system (800). Optionally a preheating laser (840) directs a preheat laser beam (845) onto the substrate coating surface (850) prior to illumination by the radiation beam (810).

In this example embodiment (800) a substrate and associated coating surface (850) is supported on a substrate support (855) such as a heated chuck, or the like, which is in turn supported on a movable linear stage (860). The movable linear stage (860) is operable to move the substrate and substrate support (855) with respect to the laser annealing beam (810) and the preheat laser beam (845), if present, during a laser annealing cycle. The motion stage is controlled by the electronic controller (730) or an intermediate controller during laser annealing operations. In various non-limiting example embodiments the beam directing module (815) includes a rotary scanning device, or the like, for raster scanning the annealing beam (835) across a first linear axis of the substrate coating surface (850) while either the substrate coating surface (850) or the laser annealing beam (835) is advanced along an orthogonal linear axis. In one embodiment a single axis raster scanner scans a substantially focused circular laser beam across one linear axis of the coating surface while the linear stage (860) moves the substrate along a perpendicular linear axis. In a further example embodiment the beam directing module (815) includes a two axis scanning module for raster scanning the annealing beam (835) across two orthogonal linear axes of the substrate coating surface (850). In any event, a combination of optical scanning by the beam directing module (815) and or linear motion of the substrate coating surface (850) is used to direct laser annealing energy over each area of the deposition film to anneal the deposition film substantially without causing material diffusion across the boundary layer between the deposition film being annealed and the under lying substrate surface supporting the deposition film being annealed.

Thus in various embodiments the linear stage (860) comprises a single linear motion stage moving the substrate along one linear axis, e.g. from left to right in FIG. 7 and in other embodiments the linear stage (845) comprises two linear stages oriented to move the substrate along two orthogonal linear axes. Alternately or additionally the beam directing module (815) comprises one or more scanning elements or beam forming elements suitable for scanning the laser annealing beam (835) over the coatings surface either along one or two orthogonal linear axes or the beam forming elements form a linear beam that illuminates an entire linear axis of the coating surface. In any case whether entirely by movement of the linear stage (860), entirely by movement of the radiation bean (810) annealing beam with the beam direction module (815) or a by combination of both, the laser annealing beam (835) is scan wise directed onto each area of the coating surface (850) with a substantially constant relative velocity of the laser annealing bean (835) with respect to the coatings surface (850).

According to a further non-limiting example embodiment of the present invention control elements are provided to monitor the temperature of the coating surface during rapid thermal annealing cycles. In the present example, the emission detector (825) includes a lens element (865) provided to form an image of the coating surface or an image of a portion of the coating surface onto the emission detector (825). In one non-limiting example embodiment the lens element (865) optionally includes a fiber optic cable or the like for delivering the image formed by the lens element (865) to the emission detector.

The emission detector (825) has a spectral response suitable for determining a temperature of the coatings surface base on the image formed thereon and provides an image signal responsive to the image of the coating surface being formed thereon. The image signal is communicated to the temperature conversion module (830) for conversion to surface temperature values. The temperature values of the coating surface are communicated to the controller (730) and or the power controller module (720). The controller (730) or the temperature conversion module (830) compare surface temperature values with a desired annealing temperature and generate a temperature variation signal proportional to the difference between the desired annealing temperature and the temperature of the coating surface as determined by the temperature conversion module (830). The temperature variation signal is used to vary the input power delivered to the laser module (805) to either increase or decrease the luminous intensity of the annealing beam (835) as required to maintain a substantially constant annealing temperature at the coating surface (850). In other non-limiting example embodiments other control elements are usable to vary surface temperature in response to temperature variation signal including changing the dwell time such as by increasing or decreasing the relative velocity of the annealing beam with respect to the coating surface, by rapidly modulating the laser output to vary the beam luminous intensive per unit time, by filtering the laser, e.g. using polarizing attenuators, by changing the position of the beam focal plane at the coating surface and by other laser attenuating methods as are well known.

As further shown in FIG. 7 an example ALD reaction chamber outline (870) is shown to indicate that in the present example embodiment the entire laser annealing system (800) is disposed external of the ALD reaction chamber and any radiation entering the ALD reaction chamber or emitted from the ALD reaction chamber passes through a substantially transparent window in a wall of the ALD reaction chamber, such as a quartz window or the like, not shown. In the example embodiment shown in FIG. 7 the linear stage (860) is disposed inside the ALD chamber outline (870) and moves both the substrate support element (855) and the substrate (850). However other embodiments are usable including disposing the linear stage (860) outside the ALD chamber outline (870) or disposing the linear stage (860) between the substrate support element (855) and the substrate (850).

Referring to FIG. 8 a non-limiting exemplary beam forming and beam directing module (900) is shown in a schematic view. In this example embodiment an optical system is configured to form a substantially stationary line of focused laser energy (905) that is directed onto the substrate surface (910) by a fold mirror (103). The longitudinal length of the linear laser beam or line of focused laser energy (905) substantially exceeds one linear dimension of the substrate coating surface (910) such that relative motion between the substrate and the linear laser beam in one linear direction illuminates the entire area of the substrate (366).

A linear lens (116) finely focuses the line of laser energy (905) onto the substrate surface (910). The substrate may be advanced past the substantially stationary line of focused laser energy (905) e.g. by a single axis linear motion stage (105) or the fold mirror and linear lens (116) may be rotated by a rotary actuator, (not shown), to advance the position of the line of focused laser energy across the substrate surface in response rotation of the fold mirror and linear lens. Alternately the optical system includes a scanning element that scans laser energy across the fold mirror such that the laser annealing beam comprises a single focused beam at the substrate surface which is scanned over a linear axis of substrate surface. Exposure time or dwell time of the annealing beam onto the coating surface can be altered by varying the substrate velocity as it is advanced past the linear focused beam or by altering the scanning rate of scanned elements.

5.3 Example 1

In a non-limiting example embodiment, the laser annealing module (735, 800) comprises a continuous wave (CW) laser module having laser radiation output having a spectral bandwidth that is readily absorbed by silicon, e.g. a visible spectral range between 300 and 1000 nm. In one example embodiment the laser (805) comprises an erbium and or ytterbium fiber laser having a narrow band spectral output centered between about 515 and 580 nm and preferably 532 nm. The laser CW output power ranges between about 50 and 500 watts but preferably 200 watts. Alternately the laser (805) may comprise a neodymium yttrium aluminum garnet (Nd YAG) laser outputting in the visible spectrum e.g. at 532 nm.

The laser beam is controlled by various sub-systems to anneal the substrate coating surface by rapidly heating the surface to an annealing temperature. In particular laser radiation thermally excites the coating surface and specifically the deposition layers in order to thermally activate local atomic relaxation in the crystal structure of the coating layers. Without being bound by a particular theory, Applicants believe that the thermal energy resulting from laser radiation directed onto the coating layer heats the coating layer to high enough temperature to allow atoms of the coating layer to rearrange into more suitable crystal lattice structure substantially matching the crystal lattice structure normally achieved by high temperature heteroepitaxial growth such as may result when heteroepitaxial coating layers are applied by conventional MOCVD processes at temperatures above 900° C.

Figure 9:
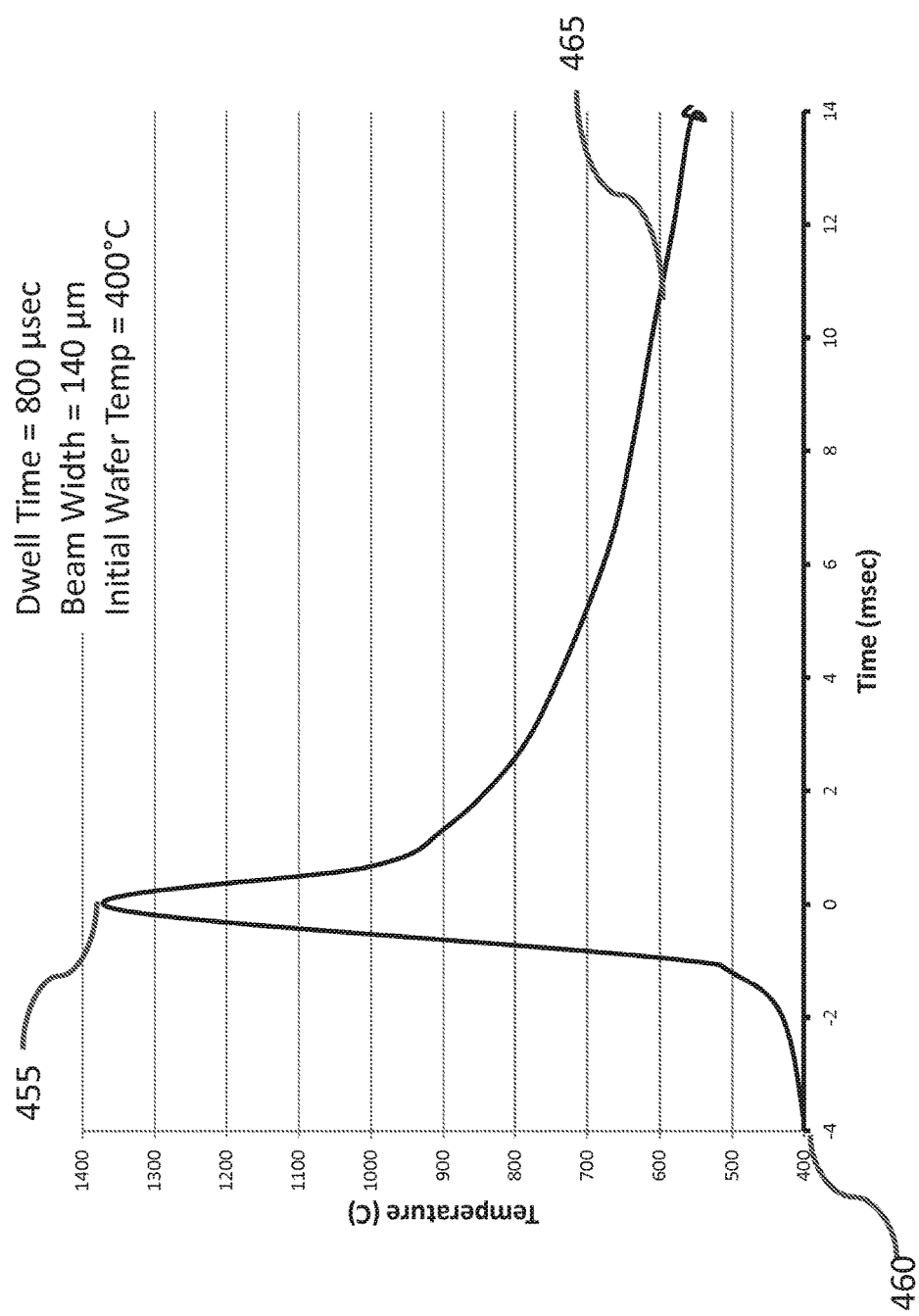
FIG. 9 depicts a plot of temperature vs time for a particular laser annealing beam and dwell time according to the present invention.

Referring to FIG. 9, the temperature in ° C. of a coating surface illuminated by a laser annealing beam described above is plotted vs time in msec as determined by optical temperature sensing devices. In the plotted example dwell time of the laser beam radiation contact with the coating surface is 800 μsec, the beam width is 140 μm, the laser output power is 200 W and the initial wafer or substrate temperature is approximately equal to the reaction or deposition temperature which in the present example is 400° C. The plot reveals that the temperature of the laser illuminated region spikes from about 400° C. (460) to about 1350° C. (455) and then cools back down to below 600° C. (465) within twelve milliseconds when the dwell time is approximately 0.8 msec. In the present example the beam width is along the axis of relative motion between the beam and the coating surface such that the full-width half maximum (FWHM) beam energy passes over a point on the coating surface in 800 μsec. In this example the beam may comprise a circular beam having a FWHM diameter of 140 μm or the beam may comprise a line beam having a FWHM line width of 140 μm. As further shown in FIG. 9 a temperature rise time associated with heating the coating surface from the deposition temperature to the peak annealing temperature is about 4 msec. Generally a rise time of less than 50 msec is usable without deviating from the present invention.

Figure 10:
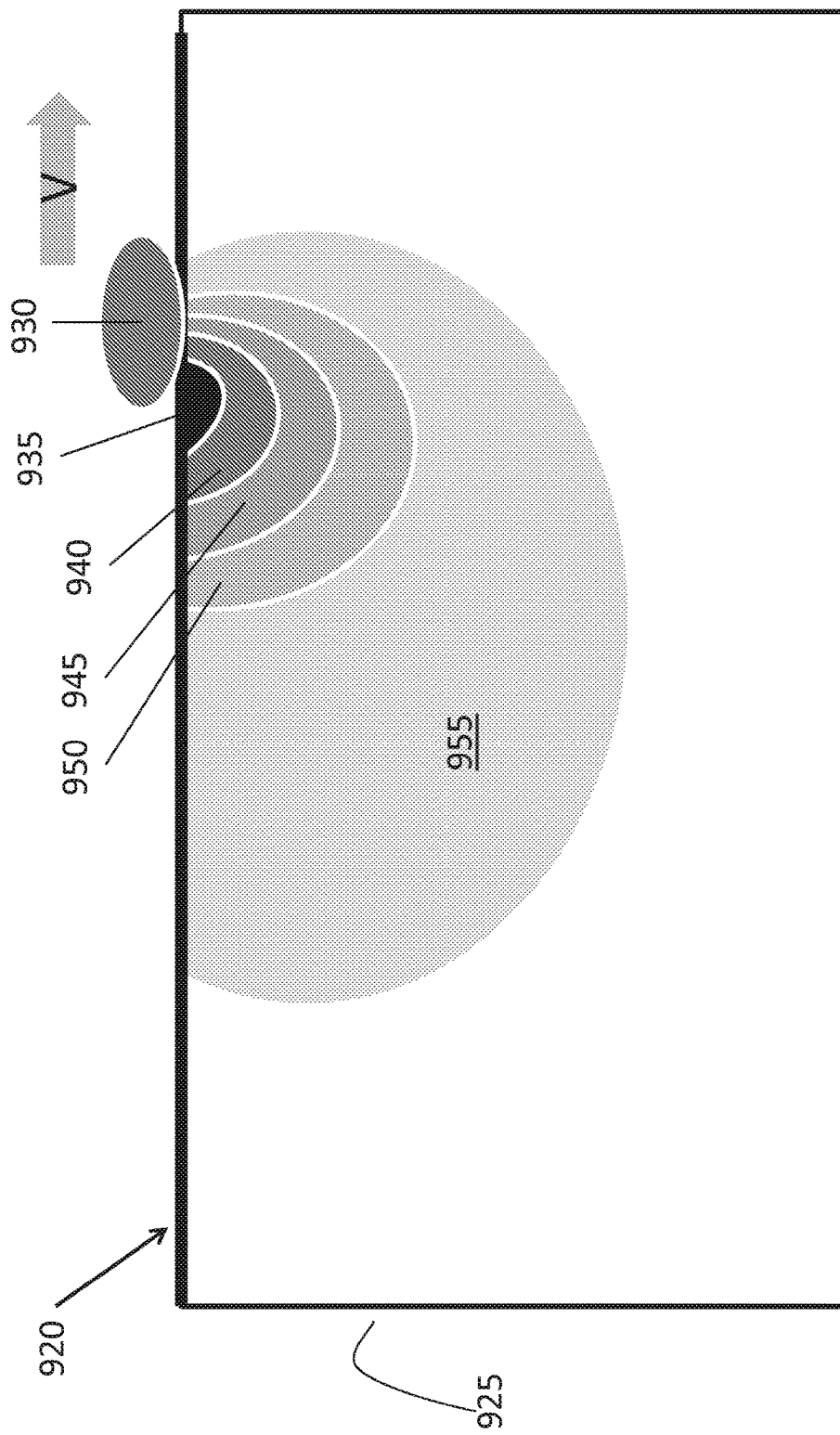
FIG. 10 depicts a thermograph showing temperature gradients associated with a particular laser annealing beam and dwell time according to the present invention.

Referring now to FIG. 10 a computer generated thermograph (920) displays the relative temperature at different regions of a silicon wafer substrate (925) after having been illuminated by the laser beam (930) described above, (i.e. 200 W laser output power, 140 μm beam width, 800 μsec dwell time) moving in the (V) direction. With brighter shades being associated with lower temperatures, the thermograph demonstrates that thermal energy generated by the laser beam (930) is dissipated into the substrate without significantly heating the entire substrate thickness. Comparing FIGS. 9 and 10 the peak temperature indicated at point (455) in FIG. 9 is 1350° C. and this temperature corresponds with the darkest region (935) of FIG. 10. In the regions (940), (945), (950), (955) the substrate temperature either never reaches the peak temperature or cools to about 600° C. is about 12 msec. Moreover the region (955) clearly demonstrates that only about half the wafer thickness increases above the base temperature of 400° C. as a result of the laser annealing beam.

The present invention offers certain benefits over conventional heteroepitaxial layer deposition at temperature above about 800° C. Additionally the same benefits can be used to improve any epitaxial film growth where high temperature growth mechanisms are undesirable, e.g. to avoid wafer bow, boundary layer diffusion and other problems associated with large thermal gradients.

In particular epitaxial layers or semi epitaxial layer can be grown by atomic layer deposition at lower deposition temperatures than conventional epitaxial growth mechanisms thereby avoiding the need to heat the substrate above about 650° C. and preferably without heating the substrate above 350° C. and this reduces wafer bow, deposition layer cracking and material diffusion across material boundary layers normally associated with high temperature processes.

While ALD deposition layers deposited at 350° C. or less than 350° C. have been shown to have some single crystal structure the orientation of the crystal structure is not reliably uniform throughout the deposition layer. However the present invention uses a rapid laser annealing process to heat the deposition layer to an annealing temperature that is high enough to remove crystal lattice dislocations and to potentially unify crystal structure orientation over the deposition layer.

However as demonstrated by the thermograph of FIG. 10 the present invention provides a method and device that heats only a small region of the substrate to the peak annealing temperature for less than about 12 msec and this offers two benefits not addressed in the prior art. The first benefit is that the short duration of the thermal cycling substantially avoids diffusion of the deposition layer material into the substrate material or the substrate material into the deposition layer simply because the thermal cycle is not long enough to initiate and maintain appreciable material diffusion. The second benefit is that about half the thickness of the wafer substrate is not even heated above the deposition temperature and much of the remaining half that is heated never reaches the peak annealing temperature. As a result wafer bow is reduced or substantially eliminated.

In a further aspect of the present invention the peak annealing temperature may be varied from one application to another and from one deposition or substrate material to another. In particular a deposition layer e.g. a single mono layer wherein the layer thickness comprises one atomic layer dislocations may be removable at peak annealing temperature ranging from 550 to 1000° C. Similarly a plurality of mono layers wherein the layer thickness comprises about two to ten atomic layers dislocations may be removable at a peak annealing temperatures ranging from 550 to 1000° C.

According to the present invention and specifically relating to annealing very thin material layers (e.g. up to about 2000 Å) of group III/V or group II/VI or group III/N compounds on single silicon substrates a first peak annealing temperature ranges from 550 to 1000° C. and this first peak annealing temperature is sufficient to provide layer recovery wherein dislocations in the crystal structure of the deposition layer are removed and the internal stress due to dislocations in the crystal structure is reduced.

According to the present invention and specifically relating to annealing very thin material layers (e.g. up to about 2000 Å) of group III/V or group II/VI or group III/N compounds on single silicon substrates a second peak annealing temperature ranges from 1001° C. to 1200° and this second peak annealing temperature is sufficient to cause recrystallizing wherein new stain free crystal grans are formed to replace those deformed by internal stress caused by the dislocations.

According to the present invention and specifically relating to annealing very thin material layers (e.g. up to about 2000 Å) of group III/V or group II/VI or group III/N compounds on single silicon substrates a third peak annealing temperature ranges from 1201° C. 1500° and this third peak annealing temperature is sufficient to cause the newly formed strain free crystal grans to grow in size.

While higher annealing temperatures are usable without deviating from the present invention an annealing temperature of not more than 1350° C. is preferred and in the specific case of a GaN deposition layer a peak annealing temperature of not more than 1200° C. is preferred.

With respect to the temporal duration of the annealing step, it is preferred that the annealing step inclusive of heating the deposition layer from the deposition temperature to a peak annealing temperature and cooling of the deposition layer back to the deposition temperature be as short as possible but preferably less than about 30 msec. Ideally the duration of the annealing step is not long enough to cause appreciable material diffusion across the heteroepitaxial boundary and the temperature rise time associated with heating the coating surface from the deposition temperature to the peak annealing temperature may be as short as 100 μsec without deviating from the present invention.

In other embodiments a $CO_2$ laser Nd YAG or other laser may be used to generate a rapid thermal annealing radiation beam with a spectral bandwidth centered at one of 9.4 or 10.6 um without deviating from the present invention.

In a further aspect of the present invention substrate surfaces may be pre-textured to promote single crystal growth. In particular using lithography and or anisotropic etch techniques such the substrate surface is textured to promote single crystal structure growth by ALD deposition. To be effective, the dimensions of the etched structure must be small enough to influence the growth of the ALD material. In most cases, the lateral dimensions are under 100 nm.

While the present invention is presented with example embodiments using ALD deposition chambers and material deposition cycles, the rapid laser annealing step of the present invention is usable with any Physical Vapor Deposition (PVD) process, Chemical Vapor Deposition (CVD) or other deposition process wherein a thin film layer is deposited onto a substrate whether the substrate and the deposition layers are the same or different material compositions or have the same or different crystal structures and it is desirable to rapidly anneal the deposition layer to in order to alter its crystal structure by rapid thermal annealing.

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications, e.g. semiconductor device manufacture those skilled in the art will recognize that its usefulness is not limited thereto and that the present invention can be beneficially utilized in any number of environments and implementations where it is desirable to alter the crystal lattice properties of a thin film layer. Accordingly, the claims set forth below should be construed in view of the full breadth and spirit of the invention as disclosed herein.

The invention claimed is:

1. A material processing apparatus for applying a material coating layer onto a coating surface of a substrate comprising:

an Atomic Layer Deposition reaction chamber including a substrate support disposed therein for supporting the substrate thereon wherein the ALD reaction chamber is operable to carry out a deposition process that includes depositing the material coating layer onto the coating surface wherein the deposition process is carried out at a deposition temperature ranging between 80 and 800° C. and at a reaction chamber internal pressure ranging between 1 and 500 mTorr;

a process gas module operable to deliver doses of process gases into the reaction chamber;

an exhaust system operably to remove process gases for the reaction chamber;

a laser annealing module operable to perform in-situ laser annealing of the coating surface;

a linear motion stage disposed to transport the substrate along a first linear axis during the laser annealing; and a controller operable to carry out ALD material deposition cycles and to carry out laser annealing of the material layer.

2. The material processing apparatus of claim 1 further comprising a substantially transparent window disposed in a wall of the ALD reaction chamber.

3. The material processing apparatus of claim 2 wherein the laser annealing module directs a laser beam onto the coating surface from outside the ALD reaction chamber wherein the laser beam passes through the substantially transparent window.

4. The material processing apparatus of claim 1 wherein the laser annealing module comprises a laser having a radiation beam output power in the range of 50-200 W wherein the radiation beam has a narrow spectral bandwidth with a center of the narrow spectral bandwidth having a wavelength in the range of 350 to 1000 nm.

5. The material processing apparatus of claim 4 further comprising beam forming and deflecting elements operable to form a substantially focused laser beam, to direct the focused laser beam onto the coating surface.

6. The material processing apparatus of claim 5 wherein the substantially focused laser beam is a line beam having a Full Width Half Maximum line width of less than 300 μm and a longitudinal line length that exceeds at least one dimension of the coating surface wherein the line beam and the coating surface are moved relatively to one another such that a dwell time of the line beam on the coating surface is in the range of 200-2000 μsec.

7. The material processing apparatus of claim 5 wherein the substantially focused laser beam is a substantially circular beam having a Full Width Half Maximum diameter of less than 300 μm wherein the substantially circular beam and the coating surface are moved relatively to one another such that a dwell time of the circular beam on the coating surface is in the range of 200-2000 μsec.

8. The material processing apparatus of claim 1 wherein the laser annealing module comprises an emission detector and an associated temperature conversion module wherein the emission detector is disposed to collect radiation from the coating surface during the laser annealing and the temperature conversion module is operable to determine a peak annealing temperature at the coating surface.

9. The material processing apparatus of claim 8 further comprising a laser power control module operable in cooperation with the temperature conversion module to modify laser input power as needed to modify the peak annealing temperature at the coating surface.

* * * * *